United States Patent [19]

Herzinger et al.

[11] Patent Number: 5,796,983

[45] Date of Patent: Aug. 18, 1998

[54] DIELECTRIC FUNCTION PARAMETRIC MODEL, AND METHOD OF USE

[75] Inventors: Craig M. Herzinger; Blaine D. Johs. both of Lincoln, Nebr.

[73] Assignee: J. A. Woollam Co. Inc., Lincoln, Nebr.

[21] Appl. No.: 514,959

[22] Filed: Aug. 14, 1995

[51] Int. Cl.$^6$ ................................................. G01N 21/00
[52] U.S. Cl. ................................................. 395/500
[58] Field of Search ................................................. 395/500

[56] References Cited

U.S. PATENT DOCUMENTS

| | | | |
|---|---|---|---|
| 4,031,370 | 6/1977 | Catherall | 364/723 |
| 4,905,170 | 2/1990 | Forouhi et al. | 364/556 |

OTHER PUBLICATIONS

Modeling The Optical Dielectric Function of The Alloy System $Al_xGa_{(1-x)}As$ Kim et al., Phys. Rev. vol. 47, No. 4, 15 Jan. 1993, p. 1876.

Temperature Dependence of Optical Properties of GaAs, J. Appl. Phys. 70(6), 15 Sep. 1991, Yao et al. p. 3261.

Saitoh, T. et al. "Evaluation of Microroughness at SiO/Si Interfaces for High Efficiency Crystalline Si Solar Structures," Photovoltaic Energy Conversion, 1994 IEEE World Conference, pp. 1648–1651, 1994.

A Modified Harmonic Oscillator Approximation Scheme for the Dielectric Constants of $Al_xGa_{(1-x)}As$, Terry, Jr., J. Appl. Phys. 70(1), 1 Jul. 1991, p. 409.

A Parametric Dielectric Function Model For Semiconductor Suitable For Spectroscopic Ellipsometry Data Analysis, Herzinger & Johs, (Not Published).

Optical Properties of Crystalline Semiconductors & Dielectrics, Forouhi et al., Phys. Rev. vol. 38, No. 3, 15 Jul. 1988 p. 1865.

Modeling The Optical Dielectric Function of Semiconductors: "Extention of The Critical–Point Parabolic Band Approx", Kim et al., Phys. Rev., vol. 45, No. 20 15 May 1992.

Optical Properties & Damage Analysis of GaAs As Single Crystals Partly Amorphized by Ion Implantation, J. Appl. Phys. 56(10), Erman et al, 15 Nov. 1984, p. 2664.

Optical Dispersion Relation for GaP, GaAs, GaSb, InP, InAs, InSb, $Al_xGa_{(1-x)}As$ & $In_{(1-x)}As_xP_{1-y}$), Adachi, J. Appl. Phys., 15 Dec. 1989 p. 6030.

Primary Examiner—Kevin J. Teska
Assistant Examiner—N. L. Dehlitsch-Moats
Attorney, Agent, or Firm—James D. Welch

[57] ABSTRACT

Novel dielectric function parametric model oscillator structures comprised of finite order polynomials and/or essentially zero-width finite magnitude discontinuities in appropriate sequences, which novel oscillator structures are suitable for application in a Kronig-Kramer consistent dielectric function oscillator structure based mathematical model, are disclosed. The present invention method of application enables production of one-dimensional normalized dependent variable vs. independent variable evaluating look-up tables by application of convolution integration effected oscillator structure Gaussian broadening, as applied to finite order polynomials, without the requirement that numerical derivatives or integrations be performed. In use, addition of contributions from one or more said present invention oscillator structures allows determination of dependent variable values given independent variable values, without requiring subtraction of relatively large numbers. In addition only a relatively small set of essentially uncorrelated present invention oscillator structure finite order polynomial term coefficient and finite magnitude discontinuity magnitude defining mathematical model coefficients are required. The present invention dielectric function model oscillator structure mathematical model allows user determinable degrees of freedom which allow essentially any plot of dielectric function dependent vs. independent variable data to be modeled with a high degree of mathematical model coefficients.

25 Claims, 4 Drawing Sheets

-A-
OBTAINING DIELECTRIC FUNCTION DEPENDENT VS. INDEPENDENT NUMERICAL VARIABLE DATA AND IDENTIFYING INDEPENDENT VARIABLE LOCATION(S) FOR ONE OR MORE DEPENDENT VARIABLE PEAK REGIONS THEREIN.

-B-
FOR EACH OF AT LEAST ONE OF SAID IDENTIFIED DIELECTRIC FUNCTION DEPENDENT VARIABLE PEAK REGIONS PROPOSING A FINITE WIDTH OSCILLATOR STRUCTURE FOR APPLICATION IN MATHEMATICAL MODELING, EACH SAID FINITE WIDTH OSCILLATOR STRUCTURE BEING COMPRISED OF ONE OR MORE FINITE ORDER POLYNOMIAL(S) AND/OR A FINITE MAGNITUDE ESSENTIALLY ZERO-WIDTH DISCONTINUITY.

-C-
ASSIGNING EACH SAID PROPOSED FINITE WIDTH OSCILLATOR STRUCTURE TO AN APPROPRIATE PEAK IN SAID DIELECTRIC FUNCTION DEPENDENT VS. INDEPENDENT VARIABLE DATA.

-D-
CAUSING A PROCEDURE TO BE EXECUTED SUCH THAT FINITE WIDTH OSCILLATOR STRUCTURE MATHEMATICAL MODEL COEFFICIENTS ARE EVALUATED, SAID PROCEDURE OPTIONALLY COMPRISING THE STEP OF APPLYING CONVOLUTION INTEGRATION EFFECTED GAUSSIAN BROADENING FACTORS TO AT LEAST SOME PRESENT NON-ZERO-FINITE-WIDTH OSCILLATOR STRUCTURE(S) WHICH CONTAIN FINITE ORDER POLYNOMIAL(S), SAID PROCEDURE TYPICALLY BEING BASED UPON REDUCING SQUARE ERROR.

-E-
UTILIZING SAID DETERMINED MATHEMATICAL MODEL COEFFICIENTS TO, FOR EACH FINITE WIDTH OSCILLATOR STRUCTURE, CALCULATE DEPENDENT VARIABLE VALUES WHICH CORRESPOND TO INDEPENDENT VARIABLE VALUES, AND COMBINING CONTRIBUTIONS FROM EACH FINITE WIDTH OSCILLATOR STRUCTURE AT EACH INDEPENDENT VARIABLE VALUE.

-F-
INSPECTING THE EVALUATED FINITE WIDTH OSCILLATOR STRUCTURE MATHEMATICAL MODEL COEFFICIENTS FOR CORRELATION THEREBETWEEN, AND INSPECTING THE RESULTS PROVIDED FROM PRACTICE OF STEP E. FOR GOODNESS OF FIT BETWEEN CORRESPONDING CALCULATED DEPENDENT VARIABLE VALUES AND ACTUAL DIELECTRIC FUNCTION DEPENDENT VARIABLE VALUES, AND IF SAID INSPECTIONS DISCLOSE LESS THAN USER DETERMINED DESIRED QUALITY, REPEATING STEPS B. TO E.

DIELECTRIC FUNCTION PARAMETRIC MODEL, AND METHOD OF USE

TECHNICAL FIELD

The present invention comprises novel Parametric Model Oscillator Structures and a method of their application; which Parametric Model, in use, requires determination of a relatively small set of essentially uncorrelated coefficients to accurately model, for instance, empirically obtained real and/or imaginary dependent variable components of the refractive index, (or dielectric function) vs. independent variable wavelength, (or equivalently the photon energy of an electromagnetic beam used in investigation). The present invention also allows convenient Gaussian Broadening of the novel Parametric Model Oscillator Structures involving a single normalized variable Convolution Integration, which results in a one-dimensional normalized variable look-up table, without the requirement that numerical derivatives or integrals be found. In addition, the method of application of the present invention does not require that error introducing differences of large numbers be found to evaluate much smaller dependent variable values.

BACKGROUND

Empirical investigation of substrate systems allows determination of the thicknesses of, and associated optical property component values, (eg. refractive index (n) and extinction coefficient (k), or real (e1) and imaginary (e2) complex dielectric function values), for films thereon.

Optical property component values for substrate systems can be empirically obtained by many methods, such as those utilizing substrate system film effected changes caused in reflected and/or transmitted light beam intensities, and those utilizing substrate system film effected changes in ellipsometric PSI and DELTA values. However obtained, resulting optical property component values, when plotted as a function of the wavelength, (ie. photon energy, which comprises a beam of electromagnetic radiation utilized in the investigation), typically present as a rather irregular plot, which irregular plot can not be accurately represented by a simple analytical mathematical function over the range of wavelengths, (ie. photon energies), typically of interest, (eg. zero (0.1) ev to six (6.0) ev, and above when determined by other than ellipsometer systems).

To understand the present invention, it is necessary to realize that the index of refraction of a substrate system film represents the ratio of the speed electromagnetic radiation traveling in vacuum to that in said film material, and that it is typically a complex number, (N=n+ik), where N is the Index of Refraction, n is termed the refractive index and k is termed the extinction coefficient. An alternative representation can be arrived at by the relation (e=N^2), and is termed the Dielectric Function, (ie. e=e1+ie2), where (e1=n^2-k^2) and (e2=2×n×k). It is also noted that the photon energy of a beam of electromagnetic radiation is related to the frequency thereof by the equation (E=h×F), where E is energy, (typically in electron volts ev), h is Plank's Constant, and F is Frequency. As well, Frequency, in electromagnetic radiation, is related to Wavelength by the relationship (C=F× W), where C is the speed of light and W is wavelength, hence (E=h×C/W). In addition, electrical properties of a material are related to the optical properties by known relationships. For instance, electrical conductivity is found to be proportional to e2.

It is also important to understand that the real and imaginary components of the Refractive Index (ie. n and k), are

2 not independent of one another. A principal of causality applies, known as the Kronig-Kramer, (K-K), relationship, and theoretically, allows determining k(E) when n(E) is known, and vice-versa. (Said (K-K) relationship relates the real part of a complex dielectric function to the imaginary part thereof by mathematical integration). Thus, assuming the Kronig-Kramer (K-K) relationship to be valid, it will be appreciated that empirical measurement of either n(E) or k(E) allows finding k(E) or n(E) respectively. And as stated infra, when k(E) and n(E) are known, e1(E) and e2(E) can be found by application of definite mathematical relationships, hence, the (K-K) relationship also relates (e1) and (e2).

Continuing, other Dielectric Function Models have been developed for semiconductors. Adachi has developed a (K-K) consistent model suitable for below energy band-gap calculations that has been used to describe ternary alloys by interpolating parameters between binary end-point, (see. S. Adachi, "Optical dispersion relations for GaP, GaAs, GaSb, InAs InSb, Al(x)Ga(1-x)As, and In(1-x)As(y)P(1-y)", Appl. Phys., Vol. 66, p. 6030, 1989). The ability to interpolate parameters produces much more physically realistic dielectric models than simply averaging dielectric functions of the end-point binary materials. For ternary alloy models, the strong Critical Point (CP) structure of semiconductors causes simple averaging schemes to produce doubled (CP) structures at the energies of binary endpoints, (see P. G. Snyder, J. A. Woollam, S. A. Alterovitz and B. Johs, "Modeling Al(x)Ga(1-x)As Optical Constants as Functions of Composition", J. Appl. Phys., Vol. 68, p. 5925, 1990). Forouhi and Bloomer have provided a dielectric model for semiconductors which is (K-K) consistent and has a very small set of coefficients, (see A. R. Forouhi and I. Bloomer, "Optical Properties of Crystalline Semiconductors and Dielectrics", Phys. Rev. B, vol. 38, p. 1865, 1988 and U.S. Pat. No. 5,905,170). The Forouhi and Bloomer model, however, has been found to have insufficient flexibility to fit existing dielectric functions accurately enough for ellipsometric modeling. Oscillator ensembles, (eg. harmonic and Lorentz), have been used to describe the above energy-gap behavior of some semiconductors and the AlGaAs alloy system, (see a paper by M. Erman, J. B. Theeten, P. Chambon, S. M. Kelso and D. E. Aspnes, titles "Optical Properties and Damage Analysis of GaAs Single Crystals partly Amorphized by Ion Implantation", J. Appl. Phys. vol. 56, p. 2664, 1984; and a paper by H. D. Yao, P. G. Snyder and J. A. Woollam, titled "Temperature Dependence of Optical Properties of GaAs", J. Appl. Phys., Vol. 70, p. 3261, 1991; and a paper by F. Terry Jr., "A Modified Harmonic Oscillator Approximation Scheme for the Dielectric Constants of Al(x)Ga(1-x)As", J. Appl. Vol. 70, p. 409, 1991). These models have been used to fit measured ellipsometric data, however, they are incapable of describing direct-energy-band-gap spectral regions, and they require extra fictitious oscillators to fill in the absorption between (CP's). Kim and Garland et al. have developed a (K-K) consistent model that can adequately describe a semiconductor dielectric function above, below and through the fundamental direct energy-gap, and this model has been applied to the AlGaAs alloy system, (see C. C. Kim, J. W. Garland, H. Abad and P. M. Raccah, "Modeling the Optical Dielectric Function of Semiconductors: Extension of the Critical-Point-Parabolic-Band Approximation", Phys Rev. B, Vol. 45, p. 11749, 1992; C. C. Kim, J. W. Garland, H. Abad and P. M. Raccah, "Modeling the Optical Dielectric Function of the Alloy System Al(x)Ga(1-x)As", Phys. Rev. B, Vol. 47, p. 1876, 1993). This model can accurately describe the dielectric function and higher order derivatives. However, to determine required internal coefficients a two stage fitting process is used. First (CP) energies and broadening are determined by fitting derivatives of the dielectric function, and then the remaining internal coefficients are determined with the energies and broadenings fixed. It will be appreciated that this model then requires that the dielectric functions exist before the model can be fitted. Furthermore, attempts at fitting all coefficients simultaneously (as necessary for direct ellipsometer data fitting), are unlikely to succeed because of the highly correlated nature of the functions internal to the model. Over part of the spectral range, the modeled imaginary part of the dielectric function results from the difference of internal function values one-hundred (100) times larger than the final value. The internal coefficients are delicately balanced to produce the proper output, and small changes in (CP) energies can cause large deviations in the model output. In addition, Lorentzian Broadening, which is known to be wrong for elements and compounds, is utilized in by Kim & Garland et al. work. While the Kim & Garland et al. work is very interesting, there remains need for an improved Parametric Model which:

a. allows relatively mathematically simple application of Gaussian Broadening Factors;
b. allows reduction of Correlation between Model Coefficients; and
c. does not require the calculation of a difference between two relatively large numbers to arrive at a much smaller Parametric Model result.

Continuing, as applied in an ellipsometry based environment, a Dielectric Parametric Function Model can be characterized by Requirements, some essential, some desirable and some which are preferable, as follows:

1. First, a Dielectric Parametric Function Model must have sufficient flexibility to describe measured ellipsometric data such that it can fit previously available dielectric functions determined by spectroscopic ellipsometry, reflectivity and by any other technique.
2. Second, a Dielectric Parametric Function Model must be able to fit model coefficients when extracting optical constants from measured PSI and DELTA data, including layered samples. That is, the model must work when optical constants are not known a-priori, and optical constant derivatives are not available.
3. Third, a Dielectric Parametric Function Model should be internally (K-K) consistent to satisfy causality considerations.
4. Fourth, a Dielectric Parametric Function Model should be based on analytical functions or loop-up tables, (preferably one-dimensional), to enhance speed of operation. That is, the model should not require use of numerical derivatives and integrations, which often make it prohibitively slow to calculate new Dielectric Function values each time a parameter is adjusted.
5. Fifth, a Dielectric Parametric function Model should have sensible ranges for internal parameters such that the model remains stable. For example, the model should not require the difference of two large numbers be calculated.
6. Sixth, a Dielectric Parametric Function Model might provide some physically relevant parameters so that a user can have some way to compare models and set up models for new materials based upon models for similar materials.
7. Seventh, a Dielectric Parametric function Model might be suitable for application to a family of semiconductor dielectric functions related by composition (ternary alloys), temperature and doping etc.

As regards the identified prior art models discussed infra, Adachi meets Requirements 3, 4, 5, 6, and 7 above and Requirement 1 below a fundamental energy band-gap only. The Forouhi and Bloomer model meets Requirement 2, 3, 4, 5, 6 and 7. Oscillator based models meet similar Requirements, and in addition meet Requirement 1 above a fundamental energy band-gap only. The Kim-Garland et al. model meets Requirement 1, 3, 4, 6 and 7.

Need exists for a dielectric Parametric Function Model which addresses all seven of the Requirements recited above, which model is highly suitable for utilization in an ellipsometry based environment. In particular, where a model of a substrate system is provided, and values for one or more film thicknesses and the optical parameters thereof are to be simultaneously determined by a regression approach, there is a definite need for a convenient means to determine Dielectric Function values.

The purposes of the present invention are summarized by stating that the present invention meets the identified need for a Dielectric Parametric function Model, and to various degrees addresses the above recited Requirements.

DISCLOSURE OF THE INVENTION

The basis of the present invention is that tabulated empirically obtained numerical data relating various dependent and independent numerical parameters to one another can be represented by graphs and mathematical relationships, and it is often more desirable to evaluate a mathematical relationship to arrive at a required dependent numerical value, which corresponds to an independent numerical value, than it is to refer to a table of data which inherently presents related dependent and independent variable data, but might require an interpolation between specifically provided independent variable data points. For instance, complex dielectric function data can be stored in tabular form such at real (e1) and imaginary (e2) components are provided as inherently related to independent variable photon energy. Over a range of six (6) electron volts, for instance, (a reasonable range where semiconductors are involved), anywhere from hundreds to thousands of independent variable photon energy data points might be present, for each (e1) and (e2), to provide a desired level of accuracy. If the data is assumed to be Kronig-Kramer (K-K) consistent, a table of data points of one thereof, (ie. (e1) or (e2)), will be sufficient to allow determination of both (e1) and (e2) at a given photon energy, thus reducing by half the number of tabulated data points necessary to allow finding both (e1) and (e2) as a function of energy level. This is because (K-K) consistent (e1) and (e2) data are related to one another by a mathematical Integration relationship. However, over a range of six (6) electron volts, for instance, there is still need to evaluate half the original number of hundreds to thousands of data points in tabular data storage is utilized, and need remains to perform interpolation, to arrive a specific values of (e1) and (e2) at a specific photon energies. (Note, theoretically, data is necessary over all photon energies from zero to infinity to apply the Kronig-Kramer (K-K) consistency relationship. In practice, however, a reasonable analytical function is utilized to model unknown data).

It should be appreciated that a mathematical relationship which allows calculation of (e1) and/or (e2) at a photon energy utilizing a relatively small number of stored numerical coefficients, would be of utility. As alluded to in the Background Section, various researchers have forwarded approaches to providing such mathematical relationships. However, none have been able to provide a mathematical model which is generally adaptable to describe essentially any dependent vs. independent variable data set, such as dielectric function components of materials over a reasonable range of photon energies, which range of photon energies can include both direct and indirect semiconductor bandgap regions, and regions therebelow and thereabove. As best appreciated by reference to graphed dielectric function component data, (see detailed Description Section and accompanying Drawings), (e2) varies in a complex manner with energy, with dependent variable "Peak" and Peak Interconnecting regions present over a range of independent variable photon energies. No simple analytical mathematical equation can provide a good fit thereto over a full range of photon energies based upon, for instance, a "Mean Square Error" (MSE) criteria. (See NUMERICAL RECIPES IN C, Cambridge University press, 1988 for a description of a (MSE) approach to data fitting. Said text is incorporated by reference into this Disclosure).

One approach to "Modeling" (e1) and/or (e2) data as a function of energy has focused upon the use of a plurality of Lorentzian or Gaussian "Oscillator Structures" centered at various photon energy levels, each such Oscillator Structure having associated therewith an Amplitude and a Broadening Factor. (See "OPTICAL PROPERTIES OF SOLIDS", by Wooten, Academic Press, 1972, p. 47–52 for a description of Lorentzian Oscillator Structures, which reference is incorporated by reference hereinto). By summing contributions from various Oscillator Structures present at a photon energy, one can then arrive at a value of, for instance, (e2) at said photon energy. It will be appreciated that only three (3) parameters must be stored to fully define each Lorentzian Oscillator Structure, (eg. Amplitude, Broadening Factor and Central Energy), thus the number of parameters which must be stored to allow arriving at a value of (e2) at a given photon energy can be greatly less than where data is stored in, for instance, a tabular form.

The problem with prior modeling approaches which utilize the summation of the effects of a plurality of Oscillator Structures to provide approximate values for (e1) and/or (e2) as a function of photon energy, is that they do not provide accurate values of (e1) and/or (e2) at all values of photon energy. While a Lorentzian or Gaussian Oscillator Structure might be capable of providing a good (MSE) fit to a "Peak" region in a plot of (e2) with respect to photon energy, for instance, unless a "Tail" region projection from said "Peak" region in said plot is precisely Mathematically Lorentzian or Gaussian, data points removed from the region of the Peak will not be well approximated thereby. That is, the shape of the "Tail" regions of the Lorentzian or Gaussian Oscillator Structure is dictated by the shape of the peak region because of a limited number of degrees of freedom available. In some cases the sum of a plurality of Lorentzian or Gaussian Oscillator Structures centered at various central energies, with various amplitudes and broadenings can be utilized to provide improved fit over a range of photon energies. However, even where this approach is utilized, the lack of a sufficient number of degrees of freedom in an Oscillator Structure based Model to allow shaping the Peak region of an Oscillator Structure independently of the shape of the Tail regions, normally prevents achieving a good (MSE) fit over a relatively large range of photon energies.

To overcome the identified shortcomings in prior Oscillator structure based Parametric Models for use in calculating Dielectric Function Component values, given a photon energy, and to met the First Requirement recited in the Background Section, (ie. that, a Dielectric Parametric Function Model provide sufficient flexibility to fit essentially any empirically derived data set), the present invention teaches that Oscillator Structures should be defined which allow sufficient degrees of freedom to allow "Peak" and "Tail" regions thereof to be mathematically modeled essentially independently. The preferred embodiment of the present invention provides that Finite Order Polynomials, (providing terms of any Order), and possibly Finite Magnitude Discontinuities, should be combined to form present invention "Oscillator Structures". A typical present invention Oscillator Structure being comprised of two Finite Order Polynomials (F1 and F2), to the left of a Center Point region, said two Finite Order Polynomials, (F1 and F2), being sequentially continuous in zero (0), first (1) and preferably second (2) derivatives at their point of merger; said two polynomials, (F1 and F2), being possibly followed by a Finite Magnitude Discontinuity; with the resulting foregoing described two additional Finite Order Polynomials, (F3 and F4), to the right of the Center Point Region, which Finite Order Polynomials, (F3 and F4), are sequentially continuous in zero (0), first (1) and preferably second (2) derivatives at their point of merger. It is also mentioned that a variation of a basic present invention Oscillator Structure provides that some of the Finite Order Polynomials can be eliminated or made to contain only various Order Terms, (eg. that is contain any of zero, first, second, third etc. Order terms, and possibly not others), and still provide a present invention Oscillator Structure. For instance, there might be only one Finite Order Polynomial on one or both sides of a present invention Oscillator Structure Center Point, and a Finite Magnitude Discontinuity might, or might not, be present and might, or might not, be preceded or followed by a Finite Order Polynomial, for instance. In any case, each present invention Oscillator Structure, (assuming more than one such Oscillator Structure is utilized), begins and ends at dependent variable (e1) and/or (e2) values of zero (0), at an independent variable photon energy which is that corresponding to the Center Point of a present invention Oscillator Structure, which can be that of the same, or another, present invention Oscillator Structure. (Note if both the beginning and end of a present invention Oscillator Structure are present at the Center Point of the same Oscillator Structure, a Zero-Width Finite Magnitude present invention Oscillator Structure "Pole" results, which is mathematically equivalent to a Finite Magnitude Discontinuity which begins at zero of a dependent variable scale at the Center Energy of the independent variable. This equivalency allows various approaches to computer programming implementation of the present invention).

it is noted that Finite Order Polynomials and Finite Magnitude Discontinuities are selected as components of present invention Oscillator Structures because said mathematical entities can be subjected to a Convolution Integration, (a procedure involving, in the present case, the product of such a Finite Order Polynomial, with or without an associated Finite Magnitude Discontinuity; and a Broadening Factor, (preferably Gaussian), which involves Error Functions and/or Exponentials, see supra). If only Finite Order Polynomials and Finite Magnitude Discontinuities are utilized to construct present invention non-Zero-Width Oscillator Structures, analytic functions and published Integral Tables, (see the "Handbook of Mathematical Functions", Abromowitz and Stegun, dover Publications, 1972 and "Table of Integrals, Series and Products", Gradhteyn and Ryzhik, Academic Press, 1980, which references are incorporated by reference herein), are available which allow relatively easy evaluation of required present invention Oscillator Structure Model Convolution Integrals which arise from the application of a present invention Oscillator Structure "Broadening Factor", (see supra). This is important as regards the Forth Requirement for a Dielectric Parametric Function Model recite in the Background Section of this Disclosure, (ie. that being that the use of numerically calculated derivatives and/or integrations should not be required, but rather that analytic expressions or look-up tables should be available to enhance calculations).

Continuing, much as a Lorentzian or Gaussian Oscillator can be "Broadened" by application of larger "full Width at Half Maximum" (FWHM), or Standard Deviation Broadening Factors, so can an Oscillator Structure of the present invention be "Broadened". In the present invention, however, a separate Convolution Integration must be applied to each present invention Oscillator Structure Finite Order Polynomial, (and adjacent Finite Magnitude Discontinuity if present), separately, over the range of photon Energy in which such is applicable. That is, Broadening is not a simple matter of applying a single larger (FWHM), for instance, over the full range of photon energy over which an Oscillator Structure applies, as is the case where Lorentzian or Gaussian Oscillators are utilized. However, attendant with the additional complications are additional present invention Oscillator Structure Degrees of Freedom, which additional Degrees of Freedom allow excellent mathematical modeling of, for instance, an (e2) vs. photon energy plot, over a range of photon energies, via a summation of contributions from a plurality of Oscillator Structures, at each photon energy. In particular, Oscillator Structures of the present invention allow essentially independent control of Peak Region, and Tail Region shaping. As can be appreciated by reference to the mathematics involved, presented supra, application of a "Broadening Factor", in combination with a Maximum Amplitude value, will be found to have the greatest effect in fitting Peak Regions, while Tail Regions will be found to be primarily affected by evaluation of Polynomial Coefficients.

Practice of the present invention will typically involve inspection of Dielectric Function (e2) vs. photon energy to determine the location(s) at which "Dependent Variable Peaks" exist. Use of plotted Dependent vs. Independent Variable data is "Center Point" of a present invention Oscillator Structure is then located at the photon energy corresponding to each Peak, with Polynomial Modeled Tails projecting to one or both sides thereof. A present invention Oscillator Structure Finite Magnitude Discontinuity might also be positioned at a Center Point. (In the case where a Dependent Variable Peak corresponds to the Band-Gap Edge in a Semiconductor, Dielectric Function Component Magnitudes often demonstrate essentially Discontinuous "Jumps" over very small changes in Energy, at a photon energy corresponding to the edge of said Band-Gap. The inclusion of finite Magnitude Discontinuities in the present invention Model speaks to Sixth (6) Requirement recited in the Background Section of this Disclosure in which it is stated that a Model might provide physically relevant parameters therein, eg. a Bandgap absorption edge). Also, each present invention Finite Width Oscillator Structure so positioned will begin and end at an independent variable (e2) value of zero (0), which zero (0) values are, (assuming more than one present invention Oscillator Structure is present), located at the Center Point Energy of a positioned present invention Oscillator Structure, which, as alluded to above, can be the same or another present invention Oscillator Structure. This approach to locating the beginnings and ends of present invention Oscillator Structures positioned on a plot of (e20 vs. photon energy, at the Center Point Energy of other present invention Oscillator Structures, allows moving a Center Point Energy position in relation to other Center Point energy positions without causing drastic effects in Model produced results at distal photon energies. This approach to locating lower and upper energy end-points of Oscillator Structure is considered new, novel and useful, though not absolutely essential to application of the present invention.

With an "appropriately" estimated number of appropriately constructed present invention Oscillator Structure(s) positioned along a photon energy axis of an (e2) vs. photon energy plot, a Finite Order Polynomial Coefficient and Finite Magnitude Discontinuity Magnitude defining Oscillator Structure Mathematical Model Parameter evaluation routine, including applied Broadening Factors, can be applied to simultaneously provide values for all Oscillator Structure Mathematical Model Coefficients, based upon, for instance, a Mean-Square-Error (MSE) criteria. (A typical Coefficient evaluation routine might utilize a Levenberg-Marquard approach). Use of said Finite Order Polynomial Coefficients and Finite Discontinuity Magnitudes in constructing present invention Oscillator Structures then allows evaluation of a present invention Oscillator Structure Mathematical Model Coefficients, in view of Convolution Integration applied Broadening Factors, which Mathematical Model Coefficients are utilized in evaluation of dependent variable, such as (e2) values, provided an independent variable value, such as photon energy. It will be appreciated that present invention Oscillator Structure Mathematical Model Coefficient values for each present invention Oscillator Structure utilized are all that have to then be available to allow calculation of a value of, for instance, (e2), given a value of, for instance, photon energy, when required. If, for example, the number of present invention Oscillator Structures utilized is seven (7), and twelve (12) variables are found necessary to define each, then only eight-four (84) Coefficient values must be stores. Thereafter, when a value of dependent variable (e2) for a given independent variable photon Energy level (ES) is desired, the various Finite Order Polynomials which are present in a range of photon energies in which the specific photon energy (ES) of interest is present are produced and evaluated at said photon energy (ES) value of interest, and the contributions of each Finite Order Polynomial are added together by a summation procedure. If necessary the value of a Finite Magnitude Discontinuity, (be it additive or subtractive), is included in the summation.

Now, in use, one can try a number of "Mathematical Models", that is, it might be found that while seven (7) present invention Oscillator Structures, each providing four (4) Polynomials, each of second (2) order, provide a good (MSE) fit over the range of Energies involved, some of the attendant Coefficients of the Mathematical Model for present invention oscillator Structures are strongly "Correlated", such that change in one thereof is attended by a directly off-setting change in one or more of the others. That would be indicative of (e2) vs. photon energy Data which are not "strong" enough to justify the number of Coefficients requiring evaluation assumed into the Mathematical Model. One might then try eliminating one or more present Oscillator Structures or possibly one or more Finite Order Polynomials from one or more of the present invention Oscillator Structures, or perhaps one might try reducing the number of Polynomial Order Terms in one or more Finite Order Polynomials present, and rerunning the Mathematical Model Coefficient evaluating program. If an equally good (MSE) fit is obtained, and less Mathematical Model Coefficieint Correlation is present, the "Modified Mathematical Model" would be considered superior. In use it has been found that far less than the above mentioned eighty-four (84) parameters are required to adequately characterize, for instance, the (e2) vs. photon energy Function of a Gallium-Arsonide Sample System. (Note, a highly correlated model is capable of providing equally as accurate Dielectric Function values as a non-correlated model. Correlation problems, however, are troublesome when arriving at the model, and when, for instance, attempting to apply it to alloy materials etc.)

Insight to the present invention can be gleamed by consideration of mathematics involved therein.

As per the Third Requirement for a Dielectric Parametric Function Model recited in the Background Section, (ie. that the Model should be Kronig-Kramer (K-K) consistent), the following Equation 1 is assumed to describe a Complex Dielectric Functions:

$$e(\omega) = 1 + i \int_0^\infty W(E)B(h\omega,E)dE \qquad \text{EQ. 1}$$

where W(E) represents a polynomial and B(hw,E) represents a Broadening Factor. The factor "hw" represents the Energy level of a beam of light used to achieved dependent vs. independent variable data, and "E" is simply a variable of integration.

Note that Eq. 1 provides that the Complex Dielectric Function is a summation of Real and Imaginary parts, and that the Imaginary part involves an Integral, while the Real part does not. This incorporates the (K-K) criteria, as per the Third (3) recited Requirement in the Background Section.

The Broadening Factor, B(hw,E), is typically Lorentzian or Gaussian and is provided by:

$$B(h\omega,E) = \int_0^\infty e^{i(h\omega-E+\gamma(s))s}ds - \int_0^\infty e^{i(h\omega+E+\gamma(s))s}ds \qquad \text{EQ. 2}$$

where:

$\gamma = \Gamma$ for lorentzian Broadening; and
$\gamma = 2\sigma^2_s$ for Gaussian Broadening.

The preferred invention Mathematical Model assumes Broadening to be Gaussian because analytical approximation equations, and Tables of Evaluated Integrals, (see previously cited Gradshteyn and Ryzhik, and Abromowitz and Stegun references), are available.

Next, assuming Gaussian Broadening and recognizing that Finite Order Polynomials in a present invention Oscillator Structure are restricted to be effective over a limited range of Energy levels, and assuming that "Zero-Width" present invention Oscillator Structures, (ie. Poles), can be present, Eq. 1 can be generalized to:

$$e(\omega) = 1 + i\sqrt{\frac{\pi}{8\sigma^2}} \int_{EMIN}^{EMAX} W(E) (e^{-y_1^2} + e^{-y_1^2}erf(iy_1) - e^{-y_2^2} - e^{-y_2^2}erf(iy_2))dE \qquad \text{EQ. 3}$$

$$y_1 = \frac{h\omega - E}{2\sqrt{2}\,\sigma}$$

$$y_2 = \frac{h\omega + E}{2\sqrt{2}\,\sigma}$$

are normalized Energy parameters, specific to each Finite Order Polynomial range in an Oscillator Structure. It is to be fully appreciated that use of said "normalized" parameters addresses Requirement 4 recited in the Background Section, as it allows a single variable dependant result after integration of products of Finite Order Polynomials and the Gaussian Broadening Factor. This is considered extremely important in practice of the present invention Method of Application as it enables evaluation of dependent variable values associated with independent variables in a Gaussian Broadened Oscillator Structure, by use of a single, rather than a multiple, variable Look-up Table, (because only a single variable remains after integration of the product of Finite Order Polynomial terms and a Gaussian Broadening Factor). In addition, known integrals aide in arriving at said One-dimensional "Look-up table" and use thereof in evaluation Dielectric Function values. If two variables remained after integration, (as is the case where normalized parameters are not introduced), a more complicated Two-dimensional Dielectric Function evaluating Look-up table would result, which would greatly complicate, if not practically precluding practice of the present invention where Gaussian Broadening is utilized. It is specifically noted that the use of normalized variables to provide a single variable dependence after the Convolution Integration of a product of Finite Order Polynomial terms and a Gaussian Broadening Factor, and which enables production of an easily utilized One-dimensional Look-up table for evaluating Gaussian Broadened Dielectric Function values as a function of photon energy, is felt to be a Patentable, utility providing, distinction with respect to all known prior art.

Continuing, as per the Forth (4) Requirement for a Dielectric Parametric function Model recited in the Background Section, (ie. that the Model should be based on analytic functions or look-up tables to enhance the speed of calculation in use), it is noted that the Gaussian based Broadening Factor term:

$$e^{-y^2}erf(iy) \qquad \text{EQ. 4}$$

can be approximated by the analytical functions:

$$\frac{i}{\pi}\left(ye^{-y^2} + \sum_{N=1}^{\infty}\left(\frac{e^{-y^2+Ny-\frac{N^2}{4}}}{N} - \frac{e^{-y^2-Ny-\frac{N^2}{4}}}{N}\right)\right) \qquad \text{EQ. 5}$$

and, as mentioned supra, tables of Integrals are available which provide evaluations of products of Finite Order Polynomial terms and Gaussian Broadening Factor Values between zero (0) and some upper limit:

$$\phi_N(x) = \int_0^x y^N(e^{-y^2} - e^{-y^2}erf(iy))dy = \int_0^x y^N\Psi(y)dy \qquad \text{EQ. 6}$$

That a Finite Order Polynomial in the present invention Oscillator Structure is generally positioned between some lower Energy and Upper Energy limit is handled by the relationship:

$$\int_a^b X(N)dN = \int_0^b X(N)dN - \int_0^a X(N)dN \qquad \text{EQ. 7}$$

In view of the above, an equation for a Complex Dielectric Parametric Function including both Broadened present invention Oscillator Structures, and Unbroadened Poles, can be derived and is generally presented, in terms of normalized Energies in EQ. 8:

EQ. 8
$$e(\omega) = 1 + i \sum_{j=1}^{M} \sum_{K=1}^{N} q1_{jk} \left( \phi_k \left( \frac{h\omega - bj}{2\sqrt{2}\ \sigma j} \right) - \phi_k \left( \frac{h\omega - aj}{2\sqrt{2}\ \sigma j} \right) \right) -$$

$$q2_{jk} \left( \phi_k \left( \frac{h\omega + bj}{2\sqrt{2}\ \sigma j} \right) - \phi_k \left( \frac{h\omega + aj}{2\sqrt{2}\ \sigma j} \right) \right) +$$

$$i \sum_{j=m+1}^{m+1+P} A_j \left( \psi \left( \frac{h\omega - E_j}{2\sqrt{2}\ \sigma j} \right) - \psi \left( \frac{h\omega + E_j}{2\sqrt{2}\ \sigma j} \right) \right)$$

where "j" identifies a specific Polynomial or Pole, and "k" is the order of a Polynomial.

It will be appreciated that the present invention allows evaluation of "q1(j,k)", "q2(j,k)" and "Aj" Coefficients by performing only summation, analytical function evaluation and Look-up table operations. With values of said "q1(j,k)" and "q2(j,k)" and "Aj" Coefficients determined, values for the present invention Oscillator Structure Mathematical Model, which are typically not simply said Coefficients, as presented the Detailed Description Section of this Disclosure, can be easily calculated.

It is mentioned that, regarding Requirement 2 recited in the Background Section, concerning a Parametric Dielectric Function Model's ability to extract optical constants from measured PSI and DELTA without the need to perform numerical differentiation and integrations, is met in the present invention, by the convenience of application of the mathematics as just described.

The Computer Program Print-Out at the end of the Detailed Description Section serves to provide full disclosure of the mathematics, and the applications thereof, involved in the implementing the present invention.

The defining coefficieints of a present invention Oscillator Structure Mathematical Model alluded to infra, which are provided by the Method of use of the present invention, are best described graphically. With this in mind it should be appreciated that the present invention will be better understood by reference to the Detailed Description Section, in coordination with the accompanying Drawings.

BRIEF DESCRIPTION OF THE DRAWINGS

FIG. 7 shows a Flow Chart which demonstrates the Method of the present invention.

DETAILED DESCRIPTION

Figure 1:
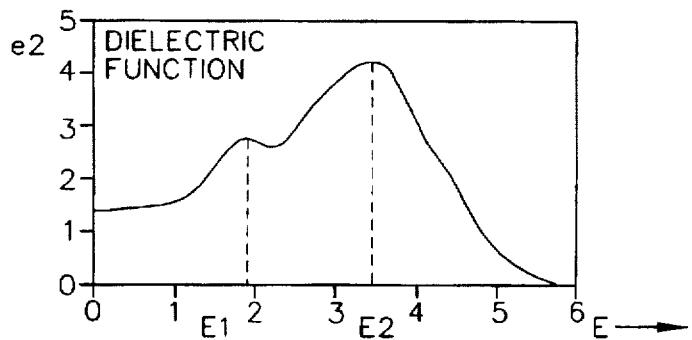
FIG. 1 shows a plot of the imaginary component of an assumed Dielectric Function vs. Energy level, presenting with two Peak Regions.
Figure 2:
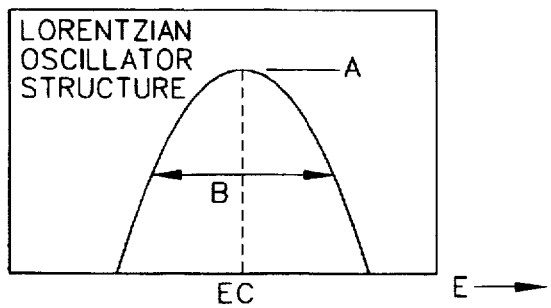
FIG. 2 shows a basic Lorentzian Oscillator Structure.
Figure 3:
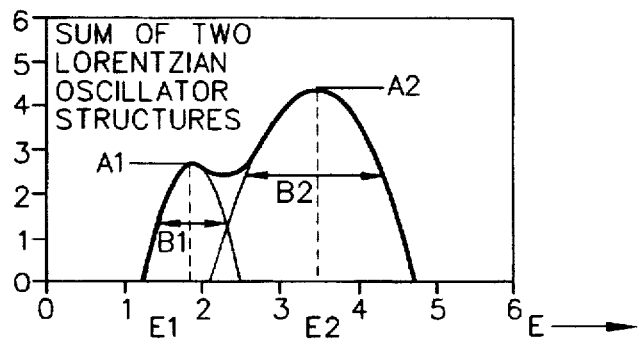
FIG. 3 shows the plot of FIG. 1, with two Lorentzian Oscillator Structures applied thereto at the Peak Regions.

Turning now to the Drawings, there is shown in FIG. 1, a plot of data corresponding to the Imaginary Component (e2) of a presumed Dielectric Function vs. Energy, which plot is representative of that which might be obtained from investigation of a semiconductor material. Note the presence of two dependent variable "Peak" regions, located at "E1" and "E2" on the independent variable "X" axis. Next, FIG. 2 shows the general shape of a Lorentzian Oscillator Structure centered about a point labeled "EC" on the independent variable "X" axis. (While not shown, Gaussian, and other Mathematical "Oscillator Structures", could also be utilized for the purposes of this demonstration). Note that the Lorentzian Oscillator Structure in FIG. 2 presents with a Maximum dependent variable Magnitude "A" and is shown with a "Full-Width-Half-Maximum" (FWHM) Broadening "B", (which Broadening can extend from Zero (0) to, theoretically, any finite value). FIG. 3 shows two such Lorentzian Oscillator Structures positioned on the (e2) vs. photon energy plot of FIG. 1. One said Lorentzian Oscillator Structure is shown with a Maximum Magnitude of "A1", a (FWHM) Broadening of "B1", and it is centered about a point on the independent variable "X" axis labeled "E1", the second Lorentzian Oscillator Structure is shown with a Maximum Magnitude of "A2", a (FWHM) Broadening of "B2", and it is centered about a point on the independent variable "X" axis labeled "E2". Note that the independent variable "X" axis points "E1" and "E2" in FIG. 1 and FIG. 2 plots correspond to one another. FIG. 3 also provides, in bold, a line representing the summation of the contributions from the two present Lorentzian Oscillator Structures, at each energy, which bold line very roughly corresponds to the (e2) vs. photon energy plot in FIG. 1. Note that the plot in FIG. 1 is, however, very different from the bold line plot in FIG. 3, particularly in the "Tail" regions beyond each "Peak" region. This demonstrates the shortcomings of an attempt to use Lorentzian Oscillator Structures to model the Imaginary Component (e2) of a Dielectric Function vs. Photon Energy. The Three (3) degrees of freedom, (ie. Maximum Magnitude, Broadening and Center Energy), which define each Lorentzian Oscillator Structure, are simply typically not sufficient to allow achieving a "good" Model fit in both Peak and Tail regions of most (e2) vs. Energy plots. However, note that sufficient data is contained in six (6) Lorentzian Oscillator Structure defining parameters to provide a rough approximation to the (e2) vs. Energy data. This compares with hundreds, or even thousands of data points were the plot in FIG. 1 is determined and characterized as a table of data. Of course, additional Lorentzian Oscillator Structures could be added to the plot in FIG. 3, in an attempt to improve the approximation result, but this approach has not been found capable of providing results sufficient for use in Ellipsometer System settings, emphasis added.

The forgoing then, demonstrates the concept of utilizing a summation of contributions from a plurality of Mathematical Structures to attempt to Model a plot of, for instance, (e2) vs. Energy data, in a manner which requires determination of a reduced number of parameter values, (as compared to an approach utilizing, for instance, tabulated data), and the foregoing also identifies the shortcomings of the demonstrated approach. The present invention serves to overcome the identified shortcomings by defining novel Oscillator Structures which provide more available degrees of freedom than provided by, for instance, the Lorentzian Oscillator Structure. This is accomplished by present invention utilization of defined novel Oscillator Structure(s), which present invention novel Oscillator Structures allow shaping the "Peak" and "Tail" regions thereof, (which "Tail" Regions project to the right and left of a "Peak" Region Center Point thereof), in a very non-correlated manner. The use of a "Broadening Factor" applied over the full range of a present invention Oscillator Structure, conceptually similar to that described infra with respect to the Lorentzian Oscillator Structure, is retained, but application thereof to a present invention Oscillator Structure is accomplished via Mathematical Convolution Integrations applied simultaneously, but independently, to various regions of a present invention Oscillator Structure. This is required, because as described directly herein, different independent variable regions of a present invention Oscillator Structure are defined, for instance, by contributions from different Finite Order Polynomials and/or Discontinuities.

Figure 4A:
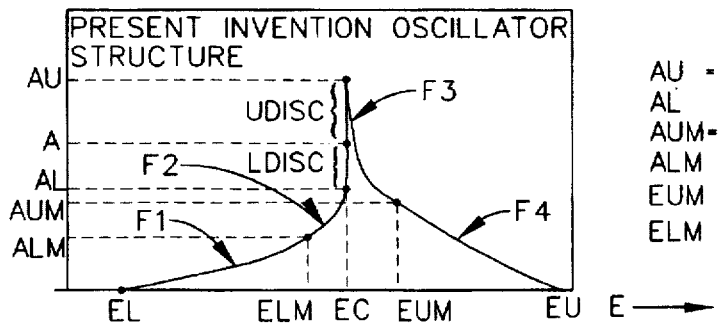
FIGS. 4a–4d show various present invention Oscillator Structures constructed by various application of Finite Order Polynomials and Discontinuities.

Turning now to FIG. 4a, there is shown a general representation of a novel present invention Oscillator Structure. Note that Four (4) Finite Order Polynomial defined regions, and one Finite Magnitude Discontinuity are shown. The Four (4) defining Polynomials are identified as F1, F2, F3 and F4, with F1 beginning at coordinates (0,EL), and merging with Polynomial F2 at coordinate (ALM,ELM). Polynomial F2 is terminated at coordinate (AL,EC) by the lower end of the LDISC region of the Discontinuity, (shown as two dimensionless regions, labeled UDISC and LDISC, above and below coordinates (A,EC)) respectively. (Note that the magnitudes of UDISC and LDISC are typically selected to be of equal finite Dimensionless Magnitudes). The upper end of the UDISC region ends at coordinates (AU,EC), whereat Polynomial F3 begins. Polynomial F3 extends to a merger with Polynomial F4 at coordinates (AUM,EUM), and Polynomial F4 intersects the independent variable "X" axis at coordinate (0,EU).

As required Oscillator Structure defining Mathematical Model Coefficients for the above described present invention Oscillator Structure(s), the following, underlined, Nine (9) Coefficients have been chosen for evaluation and application in the practice of the Method of use of the present invention:

A;
EL;
EC;
EU;
AI=A*(1+UDISC);
AL=A*(1−LDISC); (Note UDISC and LDISC are of equal magnitude)
AUM=AU*Uamp;
ALM=AL*Lamp;
EUM=EC+(EU-EC)*Upos;
ELM=EC−(EC-EL)*Lpos.

In addition, as described in the Disclosure of the Invention Section of this Disclosure, a Broadening Factor, Sigma ($\sigma$), assumed to be, but not necessarily, Gaussian, is also evaluated to determine a defined present invention Oscillator Structure. (Note, Gaussian Broadening is preferred because convenient, and novelly applied. Mathematical aides are available when such is the case, as described elsewhere in this Disclosure. It is to be understood that other Broadening criteria can be utilized and remain within the scope of the present invention.)

The "Order" of the various Finite Order Polynomials must also be identified, and such is accomplished with the use of two (2) additional parameters as follows:

For EL<E<ELM:
$$F1=ALM*((1-L2d)*y1+L2d*y1^2)$$
For ELM<E<EC
$$F2=(ALM+(1-ALM)*(1-cl-dl)*y2+cl*y2^2+dl*y2^4))$$
For EC<E<EUM
$$F3=(AUM+(1-AUM)*(1-cu-du)*y4+cu*y4^2+du*y4^4))$$

For EUM<E<EU
$$F4=AUM*((1-U2d)*y3+U2d*y3^2)$$
where:

cl=L2d*(ALM/(1−ALM))*((EC-ELM)/(ELM-EL))^2
dl=((1/(1−ALM))*(1−((EC-ELM)/(ELM-EL))*ALM*(EC-EL)* ((L2d/(ELM-EL)+(1/(EC-ELM)))
cu=U2d*(AUM/(1−AUM))*((EC-EUM)/(EUM-EU))^2
du=((1/(1−AUM))*(1−((EC-EUM)/(EUM-EU))*AUM* (EC-EU)* ((U2d/(EUM-EU)+(1/(EC-EUM)))
and where:
y1=(E-EL)/((ELM-EL);
y2=(E-ELM)/(EC-ELM);
y3=(EU-E)/(EU-EUM); and
y4=(EUM-E)/(EUM-EC);

are normalized energy terms. (Note that the y1 and y2 as used here are not the same as the y1 and y2 as defined with respect to EQ. 3 in the Disclosure of the Invention Section herein. The y1 and y2 in the disclosure of the Invention Section are related to a Gaussian Broadening Factor).

The significance of the use of "normalized" energy terms is particularly critical in application of the present invention where Gaussian Broadening of present invention Oscillator Structures is utilized. Briefly, use of normalized energy terms allows Convolution integration of a product of a Finite Order Polynomial and a Gaussian Broadening Factor to provide one-dimension, normalized, independent variable based Look-up Tables to allow convenient evaluation of corresponding dependent variables. Said significance is described more fully in the Disclosure of the Invention Section herein.

Figure 4B:
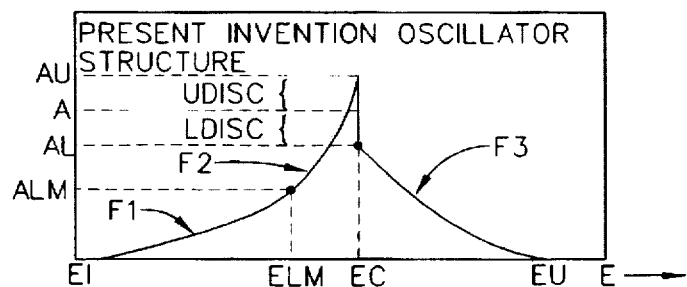
Figure 4C:
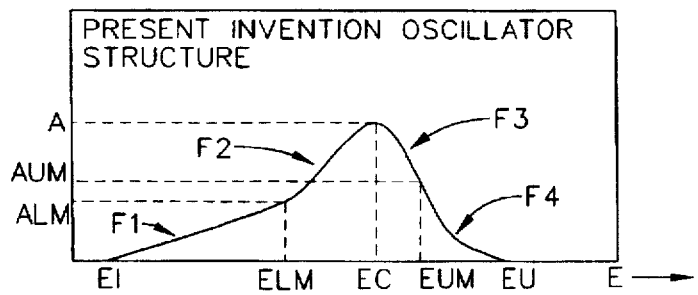
Figure 4D:
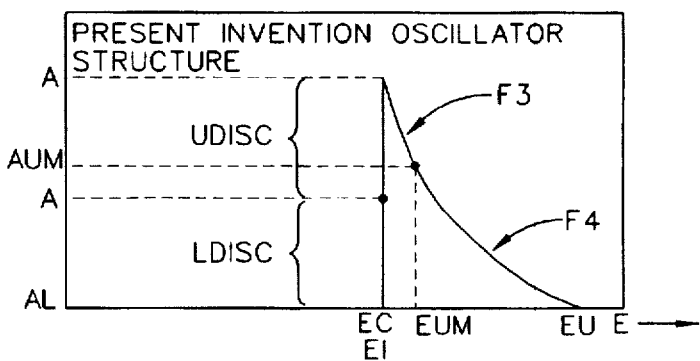
Figure 4E:
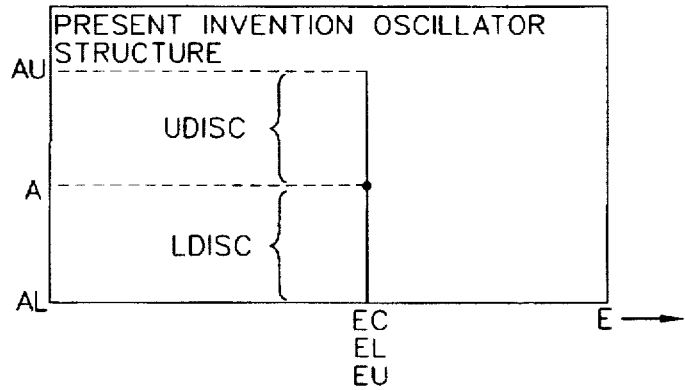
FIG. 4e shows a Zero-Width present invention Oscillator Structure, (ie. a Pole), constructed by application of coincident Lower, Center and Upper Energy levels and an Amplitude, or alternatively, a Discontinuity at a Center Energy level.

FIG. 4b shows another present invention Oscillator Structure formed from the same basic components as that in FIG. 4a, (eg. Finite Order Polynomials and Finite Magnitude Discontinuities), but in which Polynomial F2 and the upper end of UDISC meet at coordinates (AU,EC) and Polynomial F3 begins at coordinates (AL,EC) and ends at coordinates (0,EU). Note that no Polynomial F4 is present. This is demonstrative of the fact that some or all of the Four Polynomials shown in FIG. 4a can be absent while still defining a present invention Oscillator Structure. In that light note that FIG. 4e shows the case where no F1–F4 Polynomials are present, with the result being a "Zero-Width-Finite-Magnitude Oscillator Structure", or "Pole", of Zero-Width, (ie. (EL), (EC) and (EU) are coincident), but with a Finite Magnitude (AU) above the independent variable "X" coordinate (EC). (Note that FIG. 4e can alternatively be considered to show a Discontinuity of Finite Magnitude (AU) above the dependent variable zero (0) level, present at photon energy (EC), said Finite Magnitude Zero-Width Oscillator and Finite Magnitude Discontinuity interpretations being equivalent mathematically). FIG. 4c shows a case wherein Polynomials F1, F2, F3 and F4 are present, but no Discontinuity DISC, (ie. UDISC and LDISC, which are equal Finite Magnitude), is present. Polynomials F2 and F3 merge at coordinates (A,EC), which correspond to a "Peak" in this FIG. FIG. 4d shows a case in which a Discontinuity is present at "X" axis coordinate (EC), and in which Polynomials F3 and F4 are present, but Polynomials F1 and F2 are absent. It is to be understood that an analogous case wherein a Finite Magnitude Discontinuity and Finite Order Polynomials F1 and F2 are present to the left thereof, but where Finite Order Polynomials F3 and F4 are absent can also be constructed and such constitutes a present invention Oscillator Structure. It should also be appreciated that a single Finite Order Polynomial with comprising Terms thereof of opposite signs can serve to provide a peaked Dependent Variable vs. Independent Variable Plot, which begins at an dependent Variable value of zero (0.0), and returns to a dependent Variable value of zero (0.0) at some Dependent Variable value. For instance the Finite Order Polynomial (Y=3*X–X^2) begins at a "Y" value of zero (0.0) at "X"=(0.0) and returns to a "Y"=(0.0) at "X"=(3.0). Such a Single Finite Order Polynomial can serve as an additional present invention Oscillator Structure, (over a range of (0.0) to (3.0)), although coordination with other present invention Oscillator Structures and application of Convolution Integral effected Broadening thereto, presents difficulties.

It is to be noted that where two Polynomials merge, (eg. F1 and F2 , F3 and F4, or, possibly, when present without a Finite Magnitude Zero-Width Discontinuity therebetween, F2 and F3), they do so with continuous zero, first and preferably second (2) derivatives at the point of their merger. This is handled by the present invention Mathematical Model Coefficient evaluation programming involved in implementing the present invention, (see included computer program print-out).

It should then be appreciated that the present invention provides that Oscillator Structures be constructed from one or more Finite Order Polynomial(s) and Finite Magnitude Discontinuities in various sequences, and that in the presently preferred embodiment of the present invention, a typical, non-limiting, preferred present invention Oscillator Structure can include from zero (0) to Four (4), Finite Order Polynomials, each present Finite Order Polynomial including terms of any Finite Order, (eg. zero and/or first and/or second and/or third etc.), and being positioned to the right or to the left of a Center Point; and that present invention Oscillator Structures can include Finite Magnitude Discontinuities therein, present at Center Points thereof. It is also to be understood that acceptable present invention Oscillators include those of Zero (0) width, (ie. Poles) in which no Polynomials are present, said Poles being mathematically equivalent to a single Zero_Width Finite Magnitude Discontinuity, beginning at a dependent variable value of zero and positioned at a specified independent location.

In use, various constructed present invention Oscillator Structures are positioned, by a user, at appropriate locations in regions along an independent variable "X" axis, which locations correspond to "Peak" locations regions in a plot of, for instance, the dependent variable Imaginary Component of a Dielectric Function (e2) vs. Photon Energy, and via Mathematical Convolution Integration, appropriate constructed present invention Oscillator Structures are subjected to Gaussian Broadening.

The Method of Use of the present invention can then involve inspecting a plot of Dependent Variable vs Independent Variable data to be modeled, constructing present invention Oscillator Structure(s) which appear to be appropriate to fit each dependent variable "Peak" region in said plot, providing for application of Convolution Integral imposed Gaussian Broadening Factors, and then allowing a Mathematical Model Coefficient evaluating procedure, (eg. Levenberg-Marquard), operate and provide values for Finite Order Polynomial and Finite Discontinuity Magnitude defining Mathematical Model Coefficients, as determined acceptable by, for instance, a Square-Error minimizing (eg. MSE), criteria. It should also be mentioned that it is common practice to position a present invention Oscillator Structure of, for instance, "Zero-Width" and Finite Magnitude at a location to the right of all available data in a plot, which "Zero-Width" Finite Magnitude present invention Oscillator Structure serves to account for all Dependent Variable effects beyond the independent variable range of known measured data. The Method of Use of the present invention then provides that said obtained Polynomial Coefficient and Discontinuity Magnitude defining, FIG. 4 identified Mathematical Model Coefficient, (eg. A, EL, EC, EU, DISC , Uamp, Lamp, Upos and Lpos), as well as Finite Order Polynomial Order Terms describing parameters L23d and U2d, see supra), be utilized to provide easily calculated dependent variable (e2) values, given an independent variable photon energy, by means of summing contributions from all present invention Oscillator Structures present at said photon energy. (It is to be understood that the FIG. 4a Mathematical Model Defining Coefficients as identified above by underlining, are fully determinative of Oscillator Structure two (2) Term F1, F2, F3 and F4 Finite Order Polynomials Coefficients, and Zero-Width Discontinuity Magnitudes present in an Oscillator Structure). It is also to be understood that while a convenient aide, dependent variable vs. independent variable data need not be actually plotted to practice the Method of the present invention. That is, practice of the Method of the present invention can involve identifying independent variable levels corresponding to dependent variable indicated Peak regions, by purely mathematical means without the requirement that an actual plot of dependent variable vs. independent variables be constructed and visually observed. In addition, evaluation of present invention Oscillator Structure Mathematical Model Coefficients, (eg. A, EL, EC, EU, DISC, Uamp, Lamp, Upos and Lpos), can, but need not involve intermediate direct calculation of present Finite Order Polynomial Coefficients. What is required is that the various Finite Order Polynomial Coefficient Terms, (and Finite Magnitude Discontinuity Magnitudes), can be arrived at by application of present invention Oscillator Structure Mathematical Model Coefficients, as required during practice of the Method of the present invention, to allow calculating dependent variable values given independent variables.

Figure 5:
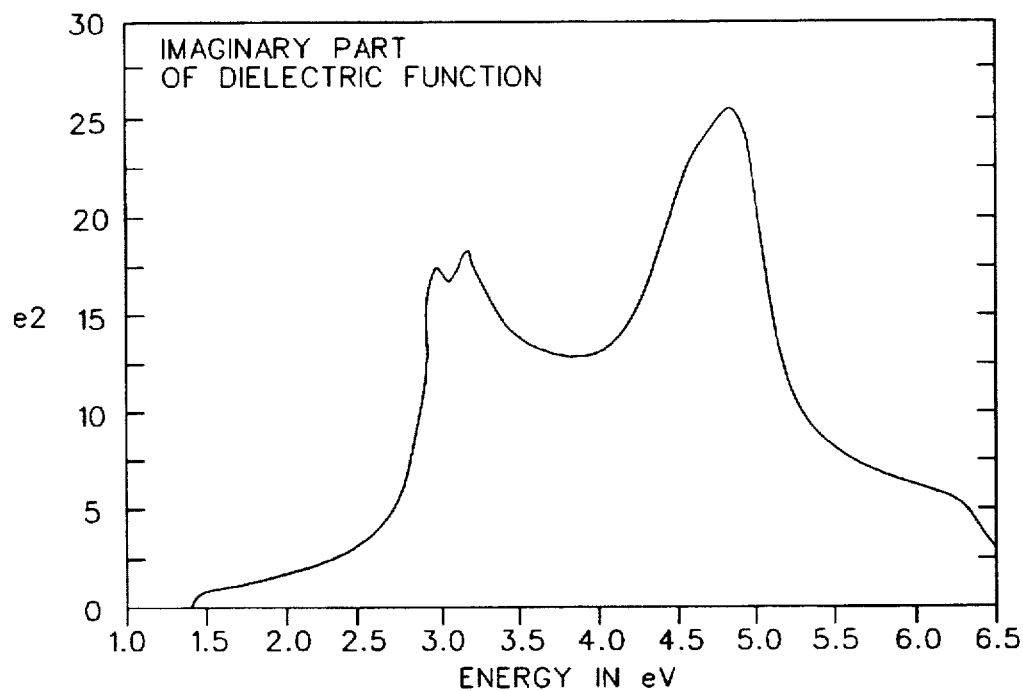
FIG. 5 shows a plot of an actual Imaginary Component of a Dielectric Function vs. Energy level for a Gallium-Arsonide Sample System.
Figure 6:
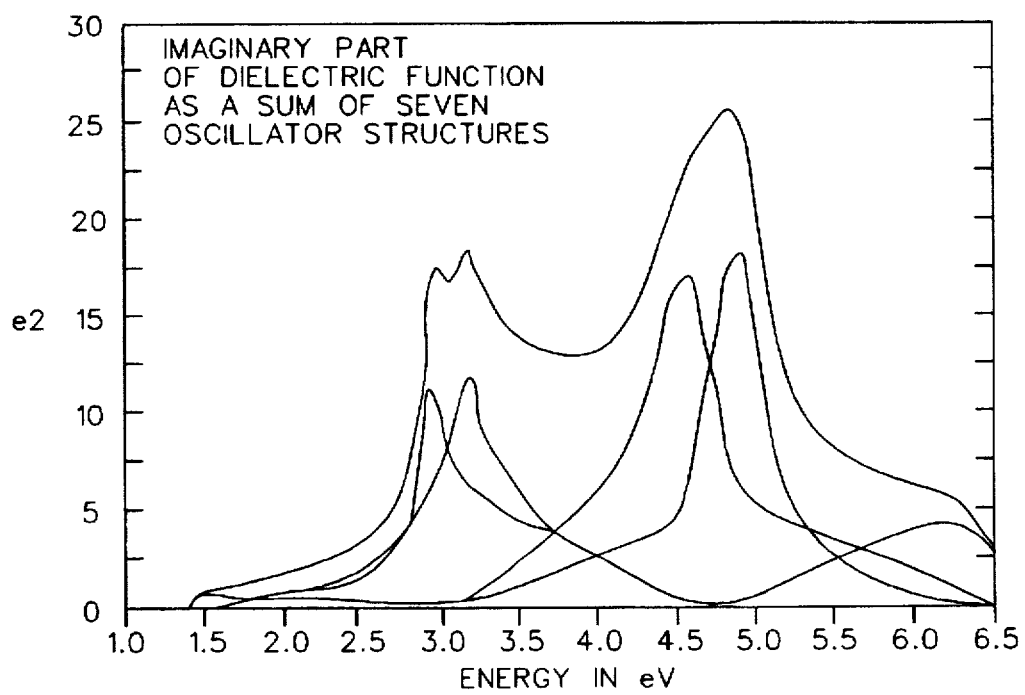
FIG. 6 shows the plot of FIG. 5 with seven (7) present invention Oscillator Structures applied thereto.

Turning now to FIG. 5, there is shown a plot of an actual Gallium-Arsonide Sample System Imaginary Dielectric Function (e2) Component vs. energy. FIG. 6 shows the plot of FIG. 5 approximated by the Summation of the contributions from seven (7) present invention Oscillator Structures, (one of which, (ie. Oscillator Structure #1 in following Table 1), is not readily visible, but is present at the left side of the plot, with an "X" coordinate (EC) of 1.785 ev). Note that each of the Seven (7) present invention Oscillator Structures is applicable over only portions of the full Energy Range in the FIG. 6 plot. The Finite Order Polynomial Coefficient and Finite Magnitude Discontinuity defining Mathematical Model Coefficients, (see infra for definition thereof), which serve to define the seven (7) present invention Oscillator Structures utilized in constructing the Mathematical Model represented in FIG. 6 are provided in Table 1.

TABLE 1

| # | EL | EU | EC | A | SIGMA | DISC | Lpos | Lamp | L2d | Upos | Uamp | U2d |
|---|----|----|------|-------|-------|------|------|-------|-----|------|-------|-----|
| 0 | 0 | 2 | 1.414 | 0.43 | 20 | 0.0 | 0.0 | 0.0 | 0 | 0.4 | 0.75 | 0 |
| 1 | 1 | 2 | 1.765 | 0.093 | 40 | 0.0 | 0.0 | 0.0 | 0 | 0.4 | 0.75 | 0 |
| 2 | 0 | 4 | 2.896 | 11.98 | 33.1 | 0.2 | 0.75 | 0.196 | 1 | 0.8 | 0.4 | 0 |
| 3 | 0 | 4 | 3.17 | 13.19 | 45.28 | 0.1 | 0.3 | 0.03 | 0 | 0.1 | 0.045 | 0 |
| 4 | 3 | 6 | 4.64 | 22.38 | 154.1 | 0.36 | 0.4 | 0.136 | 0 | 0.6 | 0.4 | 0 |
| 5 | 3 | 6 | 4.69 | 22.22 | 164.7 | 0.72 | 0.5 | 0.06 | 0 | 0.1 | 0.02 | 0 |
| 6 | 5 | 6 | 6.5 | 5.8 | 200.0 | 0.0 | 0.5 | 0.5 | 0 | 0.0 | 0.0 | 0 |
| 7 | 7 | 7 | 7.195 | 50.75 | 0.0 | 0.0 | 0.0 | 0.0 | 0 | 0.0 | 0.0 | 0 |

The Zero-Width Finite Magnitude Pole with a Magnitude of 50.75, present at 7.195 ev, (beyond the range of Energy levels shown in FIG. 6), tabulated in the seventh row of Table 1, was assumed as present to account for all effects caused by unknown data to the right of 6.5 ev. The value of the Magnitude thereof being determined by the parameter evaluation routine which also provided values for the various Finite Order Polynomial Coefficient and Finite Magnitude Discontinuity Magnitudes defining Mathematical Model Coefficients. (Note, a mathematically equivalent result could be effected by use of a Finite Magnitude Discontinuity of 50.75, beginning at at coordinates (0.0, 7.195), rather than by the use of a Zero-Width present invention Oscillator Structure, (ie. a "Pole"), as shown in Table 1).

Note, in Table 1, that the listings under (EL) and (EU) refer to the (EC) value of the indicated present invention Oscillator Structure. For instance, present invention Oscillator Structure #2 is centered at and (EC) of 2.896 ev, and begins at an (EL) of 1.414 and ends at an EU of 4.64, the EC values of present invention Oscillator Structure #0 and #4 respectively. The use of Center Point Energies (EC) of present invention Oscillator Structures as the Upper Point (EU) and Lower Point (EL) Energy levels for the same, and for other present invention Oscillator Structures utilized, provides utility in that a slight modification in the position of a Center Point Energy (EC), as might be found necessary during practice of the Method of Use of the present invention to provide an overall better Model fit, will not have a drastic effect on the Modeling of distal Energy level regions.

Continuing, note that present invention Oscillator Structure 0 is centered at 1.414 ev, and has (EL) and (EU) values of 1.414 and 2.896 respectively. That is, no F1 and F2 Polynomials are present as the (EL) and (EC) values are the same. Also note that while DISC values are provided for present invention Oscillator Structures 2 through 5, the plot in FIG. 6 does not seem to indicate the presence thereof. Application of the Broadening Factors, (ie. The Sigmas, ($\sigma$)), via Convolution Integrations, mask the initial DISC presence, (see the Disclosure of the Invention Section of this Disclosure for a description of said Convolution Integrations).

Comparison of FIGS. 5 and 6 show that the Mathematical Model arrived at by practice of the Method of Use of the present invention as applied to the plotted data in FIG. 5, provides a very close replication of said data, as shown in FIG. 6. With that in mind, it is noted that only present invention Oscillator Structure 2, (see Table 1), provides second order Polynomials, (ie. L2d is 1), and that present invention Oscillator Structures #0 and #1 have no associated F1 and F2 Polynomials present. Note, Requirement 5 recited in the Background Section, concerning Model stability is always achieved if both L2d and U2d are bounded by (+/−1). If that is the case then all Oscillator Structures will provide only positive values and a calculated Dependent Variable value can never involve a subtraction between values of similar magnitude, (see comparative discussion of the Kim and Garland et al. Parametric Model in the Background Section of this Disclosure). This is considered an important point. In addition, it has been found in practice that it is not always necessary to let all present coefficients be variable. That is, it has been found that for a family of similar materials, many of the variables in an Oscillator Structure Mathematical Model can be arrived at once, and set as constants, leaving a relatively small set of remaining variables to be modified in Mathematically Modeling similar materials. (This result, it should be realized, is responsive to the seventh Requirement recited in the Background Section of this Disclosure, which, provides that a Parameterized Dielectric Function Model should be suitable for application to a family of semiconductor dielectric functions related by composition, temperature and/or doping etc.). It should be appreciated then that while the present invention provides for Oscillator Structures with essentially unlimited degrees of freedom, often times the required degrees of freedom required are surprisingly few to provide very good Mathematical Model Coefficient (MSE) determined acceptable dependent variable vs. independent variable data fit. This is of benefit as little computational time is then required to provide values for Mathematical Model Coefficients in use.

It should be appreciated that the present invention Oscillator Structure Mathematical Model Coefficients identified as determined in Table 1 and FIG. 4a, are arbitrary, and that any Coefficients which allow evaluating present Finite Order Polynomial Coefficients and Finite Discontinuity Magnitudes, consistent with application of Convolution Integral effected Oscillator Structure Broadening, could be selected as appropriate for determination and use in calculation of dependent variable values given independent variable values, which in the above provided example were (e2) vs. Photon Energy. For purposes of Claim interpretation, the terminology "Mathematical Model Coefficients" are to be understood to include any functionally appropriate Coefficients.

It is to be understood that Dielectric Function vs. Photon Energy data used in the practice of the Method of the present invention can be obtained by Ellipsometry, and by any other applicable technique, such as Transmission and Reflectance.

it is also noted that the terminology "Finite Magnitude Discontinuity", in the strict mathematical sense implies a finite change in a magnitude over a Zero-Width. The Terminology "Essentially Zero-Width" will be utilized in the Claims when referring to Discontinuities as they are used in this invention, in recognition of the fact that physical universe variable do not demonstrate true absolute "discontinuity", and to imply that a physically meaningful Magnitude change over a relatively Small-Width is to be included within the Rights Claimed. It is also noted that a Zero-Width present invention Oscillator Structure is provided by essentially setting (EL)=(EU), at the location of (EC) in any of the FIGS. 4a–4d, while maintaining a Magnitude (A) or (AU) as appropriate. As discussed infra, this result is represented in FIG. 4e. It should also be appreciated however, that a Zero-Width Discontinuity, such as shown in FIGS. 4a and 4b, which does not originate at a lower dependent variable value of zero (0), however, is not strictly a Zero-Width present invention Oscillator Structure. As well, it is to be understood that the terminology "Finite Width" refers to a case where (EL) is not equal to (EU).

In addition, the terminology "Finite Order Polynomial" is to be understood as not limited to cases where any particular term, or series of terms is present. That is, a simple constant identity, and any equation in which a constant and/or some additional term or terms are present, rather or not all powers of a dependent variable are represented, and rather or not all terms have the same or opposite sign, are to be considered as included by said terminology. As well, any Mathematical function which can be represented by a Finite Term Power, etc. Series, to an acceptable level of accuracy, is to be considered as a "Finite Order Polynomial". For instance, a Finite Order Polynomial resulting from Truncating an Infinite Series, can accurately represent an Exponential Logarithmic Function, a Trignometric Function, a Hyperbolic Function, Exponentials of Trignometric or of Hyperbolic Functions, Inverse Trignometric or Hyperbolic Functions etc. A Truncated Fourier Series with Trignometric Cos and Sin Functions approximated by Truncated Power Series expansion terms also provides a "Finite Order Polynomial". In general, any series of terms of various powers of an independent variable is to be considered within the bounds of a "Finite Order Polynomial" for the purposes of Claim interpretation.

While the present invention is applicable to Modeling Dielectric function Components as a function of Photon Energy, it should be understood that it can also be utilized in providing a Mathematical Model for any other data which can be presented in a graphed format. As such, while independent variable (EL), (EC) and (EU) have been referred to as photon energy values, it is to be understood that they can be referred to more generally as Lower, Center and Upper Points. It should then be understood for the purposes of Claim construction that Lower Point, Central Point and Upper Point are simply more generalized language to identify points on a graph of plotted dependent vs. independent data, analogous to the demonstrated plots of FIGS. 5 and 6 described infra in which photon energies were presented.

FIG. 7 shows a Flow Chart of the Method of the present invention. Said method has as its purpose the enabling of the calculation of Dielectric Function dependent variable numerical values given independent variable numerical values, (eg. Photon Energies or Wavelengths).

the first step is shown to consist of:
A. Obtaining Dielectric Function dependent vs. independent numerical variable data and identifying independent variable locations of one or more dependent variable peak regions thereon.

The second step is shown to consist of:
B. For each of at least one of said identified dependent variable peak regions proposing a Finite Width Oscillator Structure for application in mathematical modeling of said numerical values which demonstrate a dependent-independent variable relationship, (eg. that between an Imaginary Component (e2) of a Dielectric Function vs. Photon Energy), each of said one or more proposed Finite Width Oscillator Structure(s) comprising at least one component selected from the group consisting of:
 a. a Finite-Width combination of a Finite Order Polynomial and an essentially Zero-Width, Finite Magnitude Discontinuity;
 b. a Finite-Width combination of a plurality of Finite Order Polynomials; and
 c. an essentially Zero-Width, Finite Magnitude Discontinuity.

It is noted that typical constructed Finite Width Oscillator Structures are:
1. A Finite-Width combination of a Finite Order Polynomial and an essentially Zero-Width Finite Magnitude Discontinuity to the right thereof;
2. a Finite-Width combination of a Finite Order Polynomial and an essentially Zero-Width Finite Magnitude Discontinuity to the left thereof;
3. a Finite-Width combination of two adjacent Finite Order Polynomials and an essentially Zero-Width Finite Magnitude Discontinuity to the right thereof, said two adjacent Finite Order Polynomials being merged with continuous zero and at least one higher order derivative(s);
4. a Finite-Width combination of two adjacent Finite Order Polynomials and an essentially Zero-Width Finite Magnitude Discontinuity to the left thereof, said two adjacent Finite Order Polynomials being merged with continuous zero and at least one higher order derivative(s);
5. a Finite-Width combination of two adjacent Finite Order Polynomials and an essentially Zero-Width Finite Magnitude Discontinuity to the left thereof, in combination with two adjacent Finite Order Polynomials to the right of said Essentially Zero-Width Finite Magnitude Discontinuity, with adjacent finite Order Polynomials being merged with continuous zero and at least one higher order derivative(s);
6. a Finite-Width combination of one Finite Order Polynomial and an essentially Zero-Width Finite Magnitude Discontinuity to the left thereof, in combination with two adjacent Finite Order Polynomials to the right of said essentially Zero-Width Finite Magnitude Discontinuity, with adjacent Finite Order Polynomials being merged with continuous zero and at least one higher order derivative(s);
7. a Finite-Width combination of two adjacent finite Order Polynomials and an essentially Zero-Width Finite Magnitude Discontinuity to the left thereof, in combination with one adjacent Finite Order Polynomials to the right of said essentially Zero-Width Finite Magnitude Discontinuity, with adjacent Finite Order Polynomials being merged with continuous zero and at least one higher order derivative(s);
8. a Finite-Width combination of a plurality of adjacent Finite Order Polynomials, with adjacent Finite Order Polynomials being, at points of merger therebetween, merged with continuous zero and at least one higher order derivative(s);
9. an essentially Zero-Width, Finite Magnitude Discontinuity; and
10. a Finite Order Polynomial comprised of terms of opposite sign;

It is noted that Finite Order Polynomial Coefficient(s) and any essentially Zero-Width Finite Magnitude Discontinuity Magnitude serve to define Finite Width Oscillator Structure Mathematical Model Coefficients which can be evaluated in use, and said Finite Width Oscillator Structure Mathematical Model Coefficients at least partially define a relationship between dependent and independent numerical variables over a range of said independent variable, said range corresponding to the width of a Finite Width Oscillator Structure. Said Finite Width Oscillator Structure Mathematical Model Coefficient evaluation is typically based upon a Square-Error reducing criteria.

the third step is shown to be:

C. Assigning each said proposed Finite Width Oscillator Structure to an appropriate peak in said Dielectric Function Component dependent variable vs. independent variable data.

The fourth step is shown to be:

D. Causing a procedure to be executed such that present Finite Width Oscillator Structure Mathematical Model Coefficients determined by Finite order Term Polynomial Coefficients and/or any essentially finite Magnitude Zero-Width Discontinuity Magnitude, are for each of said one or more Finite Width Oscillator Structures, evaluated. This step can include application of Convolution Integration effected Gaussian Broadening Factors to at least one present non-Zero-Width Finite Magnitude Oscillator Structure(s) which contain Finite Order Polynomial(s).

The fifth step is shown to be:

E. Utilizing said determined Mathematical Model Coefficients to, for each finite Width Oscillator Structure, calculate dependent variable values which correspond to independent variable values, and combining contributions from each Finite Width Oscillator Structure at each independent variable.

Said method of the present invention can further comprise:

F. Inspecting the evaluated Finite Width Oscillator Structure Mathematical Model Coefficients for Correlation therebetween, and inspecting the results provided from practice of step E. thereof for goodness of fit between corresponding calculated Dependent Variable values and Actual Dielectric Function Dependent Variable values, and if said inspections disclose less than user determined desired quality, repeating steps B. through E.

It is also noted that practice of the Method of the present invention ultimately depends on the skill of a user in constructing and applying present invention Oscillator Structures to data to be modeled. That is, a user of the present invention must become proficient in selecting, combining and positioning Polynomial and Discontinuity elements to provide present invention Oscillator Structure(s) for instance on a plot of data, which Oscillator Structure(s) provide sufficient, but not redundant, degrees of freedom to accurately model said plotted data. A user will typically have to try various numbers of and various combinations of Polynomials, (of various Finite Orders), and possibly include Discontinuities, to provide appropriate constructed present invention Oscillator Structure(s), and try various number of, and various positioning thereof on plots of dependent variable vs. independent variable data, to achieve good Model fit to said plotted data, by, for instance, a Square-Error, (eg. MSE), reducing criteria. As well, attention to avoidance of providing too many degrees of freedom in view of the data to be Modeled, as evidenced by high Correlation between various Polynomial Coefficients and/or Discontinuity Magnitude defining Mathematical Model parameters is necessary. However, with a bit of practice, when presented with data, a user can become demonstrably proficient in proposing and positioning a reasonable number of present invention Oscillator Structures, of appropriate constructions, to allow a good Square-Error reducing Uncorrelated Mathematical Model Coefficieint fit therefore to be achieved, which Mathematical Model requires evaluation of relatively few coefficieints to allow its application. The present invention then, is found in the definition of novel Oscillator Structures and the Method of application thereof in Modeling data. The utility of the present invention is found in the fact that by appropriate Construction and Broadening of, and application of, novel present invention Oscillator Structure(s) which are comprised of Finite Order Polynomials and/or possibly finite Magnitude Discontinuities, a Mathematical Model for essentially any data can be developed which can be made to be acceptable under essentially arbitrarily user defined (MSE) and Mathematical Model Coefficient Correlation criteria, which Mathematical Model requires determination of but a relatively few Parameters.

The present invention also, and importantly, identifies an independent variable normalization which allows convolution Integration effected Gaussian broadening of present invention Finite Order Polynomial based Oscillator Structures, which normalization enables convenient provision of a result involving only a single independent variable, after said Convolution Integration. This enables production of "One-dimensional Look-up" Tables to evaluate dependent variables, given independent variables. In addition, it is not necessary to perform numerical derivatives or integrations to effect said Gaussian Broadening. Also, as stated infra, practice of the present invention does not require finding the difference between two relatively large numbers to arrive at an error prone, much smaller number. No known prior art provides such capability and convenience.

To assure full disclosure, the following computer Program Print-Out is provided. Said Computer Program is the actual Code utilized in practice of the present invention and serves to evaluate the Coefficients of the Mathematical Model described infra, including the Gaussian Broadening procedure and formation of One-Dimensional Look-Up Tables.

```
struct PSEMI {
        double Am[20],Br[20],En[20],Asym[20];
        double FL[20],LP1[20],LP2[20],FR[20],RP1[20],RP2[20];
        double PolePos,PoleMag,PolePos2,PoleMag2;
        int ConnectLeft[20],ConnectRight[20],Selected[20];
};
const int NUM_LO_POINTS=1000;
const double BREAK_POINT=20.;
complex *int_gauss_low[5];
double int_factor[11]={1./3.,4./3.,2./3.,4./3.,2./3.,4./3.,2./3.,4./3.,2./3.,4./3.,1./3.};
int GaussCalculated=0;
complex GaussOsc(double y){
        int j,start,finish,inv=0; double x,t; complex c;
        if(y<0){inv=1; y=-y;}
        x=0;
```

```
        j=1. do{t=y+.5*j; t=exp(-t*t)/j; x=t; j++;} while(t)>1e-12);
        start=2*y-12; if(start<1) start=1; finish=start+24;
        for(j=start;j<=finish;j++) {t=y-5*j; t=exp(t*t)/j; x+=t;}
        c.i=exp(-y*y); c.r=-(y*c.i+x)/PI; if(inv)c.r=c.r;
        return(c);
}
void GaussInterp(double.y,complex □, int num){
        int i,j,inv=0; double r2,i2,c1,c2,c3,c4,d,y1,y2,y3,y4,x12,x13,x14,x23,x24,x34;
        double sc1,sc2;
        double xm,xr,x10;
        if(y<0) {inv=1;y=-y;}
        if(y<BREAK_POINT){
                y*=NUM_LO_POINTS/BREAK_POINT; i=y; if(i<1) i=1;
                y1=y(i-1); y2=y-i; y3=y(i+1);y4=y(i+2);
                c1=-1./6.*y2*y3*y4; c2=1./2.*y1*y3*y4;
                c3=-1./2. *y1*y2*y4; c4=1./6.*y1*y2*y3;
//y*=NUM_LO_POINTS/BREAK_POINT; i=y;sc1=y-i;sc2=-1.-sc1;           TABLE CALCULATION
                for(j=0;j<num; j++){
//              a[j].r=sc2*int_gauss_low[j][i].r+sc1*int_gauss_low[j][i+1].r;
//              a[j].i=sc2*int_gauss_low[j][i].i+sc1*int_gauss_low[j][i+1].i;
                a[j].r=c1*int_gauss_low[j][i-1].r+c2*int_gauss_low[j][i].r
                        +c3*int_gauss_low[j][i+1].r+c4*int_gauss_low[j][i+2].r;
                a[j].i=c1*int_gauss_low[j][i-1].i+c2*int_gauss_low[j][i].i
                        +c3*int_gauss_low[j][i+1].i+c4*int_gauss_low[j][i+2].i;
                if(inv){
                        if(j!=1 &&j!=3) a[j].i=-a[j].i;
                           else, a[j].r=a[j].r;
                }
        }
} else {
        xm=1; x10=1;
        for(j=0;j<num=;j++){
                switch(j){
                        case 0: xr=in(BREAK_POINT)-in(y); break;
                        case 1: xr=x10-xm; break;
                        case 2: xr=.5*(x10-xm); break;
                        case 3: xr=1./3.*(x10-xm); break;
                        case 4: xr=.25*(x10-xm); break;
                }
                xm*=y; x10*=BREAK_POINT;
                a[j].r=xr*0.564189584+int_gauss_low[j][NUM_LO_POINTS].r;
                a[j].i=int_gauss_low[j][NUM_LO_POINTS].i;
                if(inv){
                        if(j!=1 &&j!=3) a[j].i=a[j].i;
                           else a[j].r=-a[j].r;
                }
        }
  }
}
complex psemi_nk(PSEMI &p double w){
        int i,j;
        double a1,b1,c1,d1,EC,EL,ER,EM,dECM,dEML,AM,AM1,t1,t2,dECM2;
        complex Cp,Cm,C4,x,Ap1,Ap2,Ap4,Am1,Am2,Am4,tx,A,wELp,wELm,wECp,wECm;
        double w2,w3,w4,G,G2,G3,G4,AA,B,C,D,x1,x2;
        complex am[5],ap[5],mm[5],mp[5],cm[5],cp[5];
        w2=w*w; w3=w*w2; w4=w2*w2;
        x.r=1.0+p.PoleMag/(p.PolePos*p.PolePos-w2)+p.PoleMag2/(p.PolePos2*p.PolePos2=w2-w2); x.i=0;   STORE TABLES
        if(!GaussCalculated){
                int i,j,k,m; double x,xx,int_const; complex s,t;
                GaussCalculated=1;
                int_gauss_low[0]=(complex*)malloc(sizeof(complex)*(NUM_LO_POINTS+5));
                int_gauss_low[1]=(complex*)malloc(sizeof(complex)*(NUM_LO_POINTS+5));
                int_gauss_low[2]=(complex*)malloc(sizeof(complex)*(NUM_LO_POINTS+5));
                int_gauss_low[3]=(complex*)malloc(sizeof(complex)*(NUM_LO_POINTS+5));
                int_gauss_low[4]=(complex*)malloc(sizeof(complex)*(NUM_LO_POINTS+5));
                for(k=0; k<5; k++){
                        s.r=s.i=0;
                        int_const=.1*BREAK_POINT/NUM_LO_POINTS;
                        for(i=0; i<NUM_LO_POINTS+5; i++){
                                int_gauss_low[k][i].r=s.r*int_const; int_gauss_low[k][i].i=s.i*int_const;
                                for(j=0;j<=10;j++){
                                        x=(i*10+j)*int_const;
                                        t=GaussOsc(x);
                                        if(k>0){
                                                xx=x;
                                                for(m=1; m<k;m++) xx*=x;
                                                tr*=xx; ti*=xx;
                                        }
                                        s.r+=t.r*int_factor[j];s.i+=t.i*int_factor[j];
                                }
```

-continued

```
        }
    }
}
for(i=0; i<20; i++){
    if(!p.Selected[i]) continue;
    //Gaussian Broadening
    EC=p.En[i]; EL=p.En[p.ConnectLeft[i]]; ER=p.En[p.ConnectRight[i]];
    if(EL>=EC && ER<=EC), continue;
    G=p.Br[i]*.001*1.2; G2=G*G; G3=G*G2; G4=G2*G2;
    GaussInterp((w+EC)/G,cp,5); GaussInterp((w-EC)/G,cm,5);       MODEL CALCULATIONS
//// x=x+(GaussOsc((w-EC)/G)-GaussOsc((w+EC)/G)) * RP2[i];
    if(EL<EC){
        EM=EL+p.FL[i]*(EC-EL); AM=p.LP1[i]; b1=p.LP2[i];
        AM1=1/(1-AM); dEML=EM-EL;
        GaussInterp((w+EM)/G,mp,5); GaussInterp((w-EM)/G,mm,5);
        GaussInterp((w+EL)/G,ap,3); GaussInterp((w-EL)/G,am,3);
        x1=(w+EL)*(b1*(w+EM)-dEML); x2=(w-EL)*(b1*(w-EM)+dEML);
        tx.r=(ap[0].r-mp[0].r)*x1+(am[0].r-mm[0].r)*x2; tx.i=(ap[0].i-mp[0].i)*x1+(am[0].i-mm[0].i)*x2;
        x1=G*(dEML-2*b1*w-b1*(EM+EL)); x2=G*(b1*(EM+EL)-dEML-2*b1*w);
        tx.r+=(ap[1].r-mp[1].r)*x1+(am[1].r-mm[1].r)*x2; tx.i+=(ap[1].i-mp[1].i)*x1+(am[1].i-mm[1].i)*x2;
        x1=b1*G2;
        tx.r+=(ap[2].r-mp[2].r+am[2].r-mm[2].r)*x1; tx.i+=(ap[2].i-mp[2].i+am[2].i-mm[2].i)*x1;
        x=x+AM*p.AM[i]*(1-p.Asym[i])*0.564189584/(dEML*dEML)*tx;
        dECM=(EC-EM); dECM2=dECM*dECM;
        d1=c1=dECM/dEML; c1*=c1*b1*AM*AM1;
        d1=AM1*(1-d1*AM*(EC-EL)*(b1/dEML+1./dECM);
        D=-4*d1*EM; C=6*d1*EM*EM+c1*dECM2; B=dECM2*(dECM*(1-c1)-(EC+EM)*c1)-4*EM*EM*EM*d1;
        AA=EC*EM*(dECM2*(c1+EM/EC-1)+(EC*EC-3*EM*dECM)*d1)+dECM2*dECM2*AM1*AM;
        x1=AA-B*w-D*w3+C*w2+d1*w4; x2=AA+B*w+D*w3+C*w2+d1*w4;
        tx.r=(mp[0].r-cp[0].r)*x1+(mm[0].r-cm[0].r)*x2; tx.i=(mp[0].i-cp[0].i)*x1+(mm[0].i-cm[0].i)*x2;
        x1=-G*(2*C*w-3*D*w2-B+4*d1*w3); x2=-G*(2*C*w+3*D*w2+B+4*d1*w3);
        tx.r+=(mp[1].r-cp[1].r)*x1+(mm[1].r-cm[1].r)*x2; tx.i+=(mp[1].i-cp[1].i)*x1+(mm[1].i-cm[1].i)*x2;
        x1=G2*(C-3*D*w+6*d1*w2); x2=G2*(C+3*D*w+6*d1*w2);
        tx.r+=(mp[2].r-cp[2].r)*x1+(mm[2].r-cm[2].r)*x2;tx.i+=(mp[2].i-cp[2]i*x1+(mm[2].i-cm[2].i)*x2;
        x1=G3*(D-4*d1*w); x2=-G3*(D+4*d1*w);
        tx.r+=(mp[3].r-cp[3].r)*x1+(mm[3].r-cm[3].r)*x2;tx.i+=(mp[3].i-cp[3].i)*x1+(mm[3].i-cm[3].i)*x2;
        x1=d1*G4;
        tx.r+=(mp[4].r-cp[4].r+mm[4].r-cm[4].r)*x1; tx.i+=(mp[4].i-cp[4].i+mm[4].i-cm[4].i)*x1;
        x=x+(1-AM)*p.Am[i]*(1.p.Asym[i])*0.564189584/(dECM2*dECM2)*tx;
    }
    if(ER>EC){
        EL=ER;
        EM=EL+p.FR[i]*(EC-EL); AM=p.RP1[i]; b1=p.RP2[i]; //b1=0;
        AM1=1/(1-AM); dEML=EM-EL;
        GaussInterp((w+EM)/G,mp,5); GaussInterp((w-EM)/G,mm,5);
        GaussInterp((w+EL)/G,ap,3); GaussInterp((w-EL)/G,am,3);
        x1=(w+EL)*(b1*(w+EM)-dEML);
        x2=(w-EL)*(b1*(w-EM)+dEML);
        tx.r=(ap[0].r-mp[0].r)*x1+(am[0].r-mm[0].r)*x2;
    tx.i=(ap[0].i-mp[0].i*x1+(am[0].i-mm[0].i)*x2;
        x1=G*(dEML-2*b1*w-b1*(EM+EL)); x2=G*(b1*(EM+EL)-dEML-2*b1*(w);
        tx.r+=(ap[1].r-mp[1].r)*x1+(am[1].r-mm[1].r)*x2; tx.i+=(ap[1].i-mp[1].i)*x1+*(am[1].i-mm[1].i)*x2;
        x1=b1*G2;
        tx.r+=(ap[2].r-mp[2].r+am[2].r-mm[2].r)*x1; tx.i+=(ap[2].i-mp[2].i+am[2].i-mm[2].i)*x1;
        x=x-AM*p.Am[i]*(1+p.Asym[i])*0.564189584/(dEML*dEML)*tx;
        dECM=(EC-EM); dECM2=dECM*dECM;
        d1=ci=dECM/dEML; c1*=c1*b1*AM*AM1;
        d1=AM1*(1-d1*AM*(EC-EL)*(b1/dEML+1/dECM)).
        D=4*d1*EM; C=6*d1*EM*EM+c1*dECM2; B=dECM2*(dECM*(1-d1)-(EC+EM)*c1)-4*EM*EM*EM*d1;
        AA=EC*EM*(dECM2*(c1+EM/EC-1)+(EC*EC-3*EM*dECM)*d1)+dECM2*dECM2*AM1*AM;.
        x1=AA-B*w-D*w3+C*w2+d1*w4; x2=AA+B*w+D*w3+C*w2+d1*w4;
        tx.r=(mp[0].r-cp[0]r)*x1+(mm[0].r)*x2; tx.i=(mp[0].i-cp[0].i)*x1+(mm[0].i-cm[0].i)*x2;
        x1=-G*(2*C*w-3*D*w2-B+4*d1*w3); x2=-G*(2*C*w+3*D*w2+B+4*d1*w3);
        tx.r=(mp[1]r-cp[1].r)*x1+(mm[1].r-cm[1].r)*x2; tx.i+=(mp[1].i-cp[1].i)*x1+(mm[1].i-cm[1].i)*x2;
        x1=G2*(C-3*D*w+6*d1*w2); x2=G2*(C+3*D*w+6*d1*w2);
        tx.r+=(mp[2].r-cp[2].r)*x1+(mm[2].r-cm[2]r)*x2; tx.i+=(mp[2].i-cp[2].i)*x1+(mm[2].i-cm[2].i)*x2;
        x1=G3*(D-4*d1*w); x2=-G3*(D+4*d1*w);
        tx.r+=(mp[3].r-cp[3].r)*x1+(mm[3].r-cm[3].r)*x2,i+=(mp[3].i-cp[3].i)*x1+(mm[3].i-cm[3].i)*x2;
        x1=d1*G4;
        tx.r+=(mp[4].r-cp[4].r+mm[4].r-cm[4]r)*x1; tx,i+=(mp[4].i-cp[4].i+mm[4].i-cm[4].i)*x1;
        x=x-(1-AM)*p.Am[i]*(1+p.Asym[i])*0.564189584/(dECM2*dECM2)*tx;
    }
}
if(x.i<1e-6)x,i=0;
return(x);
}
```

Having hereby disclosed the subject matter of the present invention, it should be obvious that many modifications, substitutions, and variations of the present invention are possible in light of the teachings. It is to be understood that the invention can be practiced other than as specifically described, and should be limited in breadth and scope only by the Claims.

We claim:

1. A finite width oscillator structure for application in mathematical modeling of dielectric function numerical data which demonstrate a dependent-independent variable relationship comprising at least one dependent variable peak, said finite width oscillator structure comprising a selection from the group consisting of:

a. an essentially zero-width, finite magnitude discontinuity;
  b. a finite-width combination of a finite order polynomial and an essentially zero-width, finite magnitude discontinuity;
  d. a finite-width combination of a finite order polynomial and an essentially zero-width finite magnitude discontinuity, and a plurality of additional finite order polynomials;
  e. in sequence, two adjacent finite order polynomials, an essentially zero-width finite magnitude discontinuity, and a third finite order polynomial, said two adjacent finite order polynomials being merged with continuous zero and at least one higher order derivatives at their point of merger;
  f. in sequence, a finite order polynomial, an essentially zero-width finite magnitude discontinuity, and two additional finite order polynomials, said two additional finite order polynomials being merged with continuous zero and at least one higher order derivatives at their point of merger;
  g. in sequence, two adjacent finite order polynomials, an essentially zero-width discontinuity, and two additional adjacent finite order polynomials, with adjacent finite order polynomials being merged with continuous zero and at least one higher order derivatives at points of merger; and
  h. in sequence, a finite order polynomial, an essentially zero-width finite magnitude discontinuity and a second finite order polynomial;

each said finite order polynomial comprising coefficient(s) and said essentially zero-width finite magnitude discontinuity comprising a magnitude, which finite order polynomial coefficient(s) and essentially zero-width finite magnitude discontinuity magnitude determine finite width oscillator structure mathematical model coefficients; such tat in use said finite width oscillator structure is positioned under a dielectric function dependent variable peak in said dielectric function numerical data which demonstrate a dependent-independent variable relationship comprising at least one dependent variable peak, and finite width oscillator structure mathematical model coefficients are evaluated by a square-error reducing criteria fit to said dielectric function data, which finite width oscillator structure mathematical model coefficients at least partially define a relationship between dependent and independent numerical variables over a range of said independent variable corresponding to the finite width of said finite width oscillator structure.

2. A finite width oscillator structure as in claim 1, which finite width oscillator structure is Kronig-Kramer consistent.

3. A finite width oscillator structure for application in mathematical modeling of dielectric function numerical data which demonstrate a dependent-independent variable relationship comprising at least one dependent variable peak, said finite width oscillator structure comprising at least one component selected from the group consisting of:

a. a finite-width combination of a finite order polynomial and an essentially zero-width, finite magnitude discontinuity; and
  b. a finite-width combination of a plurality of finite order polynomials;

each said finite order polynomial comprising coefficient(s) and said essentially zero-width finite magnitude discontinuity comprising a magnitude, which finite order polynomial coefficient(s) and essentially zero-width finite magnitude discontinuity magnitude determine finite width oscillator structure mathematical model coefficients; which finite width oscillator structure is subjected to a Gaussian broadening factor by convolution integration with each present finite order polynomial, the result of which convolution integration involves only a single normalized independent variable, thereby producing a one-dimensional look-up table for evaluating a dependent numerical value given an independent numerical value, said result being achieved without the requirement that numerical derivatives or integrations be performed to effect evaluation of said mathematical model coefficients; such tat in use said finite width oscillator structure which is subject to Gaussian broadening is positioned under a dielectric function dependent variable peak in said dielectric function numerical data which demonstrate a dependent-independent variable relationship comprising at least one dependent variable peak, and finite width oscillator structure mathematical model coefficients are evaluated by a square-error reducing criteria fit to said dielectric function data, which finite width oscillator structure mathematical model coefficients at least partially define a relationship between dependent and independent numerical variables over a range of said independent variable corresponding to the finite width of said finite width oscillator structure.

4. A finite width oscillator structure as in claim 3, which finite width oscillator structure is Kronig-Kramer consistent.

5. A finite width oscillator structure for application in mathematical modeling of dielectric function numerical data which demonstrate a dependent-independent variable relationship comprising at least one dependent variable peak, said finite width oscillator structure comprising:

a. at least one finite order polynomial; and
  b. an essentially zero-width finite magnitude discontinuity;

each said finite order polynomial comprising coefficient(s) and said essentially zero-width finite magnitude discontinuity comprising a magnitude, which finite order polynomial coefficient(s) and essentially zero-width finite magnitude discontinuity magnitude determine finite width oscillator structure mathematical model coefficients; which finite width oscillator structure is subjected to a Gaussian broadening factor by convolution integration with each present finite order polynomial, the result of which convolution integration involves only a single normalized independent variable, thereby producing a one-dimensional look-up table for evaluating a dependent numerical value given an independent numerical value, said result being achieved without the requirement that numerical derivatives or integrations be performed to effect evaluation of said mathematical model coefficients; such that in use said finite width oscillator structure which is subject to Gaussian broadening is positioned under a dielectric function dependent variable peak in said dielectric function numerical data which demonstrate a dependent-independent variable relationship comprising at least one dependent variable peak, and finite width oscillator structure mathematical model coefficients are evaluated by a square-error reducing criteria fit to said dielectric function data, which finite width oscillator structure mathematical model coefficients at least partially define a relationship between dependent and independent numerical variables over a range of said independent variable corresponding to the finite width of said finite width oscillator structure.

6. A finite width oscillator structure as in claim 5, which oscillator structure is Kronig-Kramer consistent.

7. A finite-width oscillator structure as in claim 5 in which the essentially zero-width finite magnitude discontinuity separates two finite order polynomials.

8. A finite-width oscillator structure as in claim 5 which comprises at least two finite order polynomials.

9. A finite-width oscillator structure as in claim 8 in which adjacent merging finite order polynomials merge with zero and first derivatives being continuous at the point(s) of merger.

10. A finite-width oscillator structure as in claim 9 in which the second derivative at the point(s) of merger between two adjacent finite order polynomials is also continuous.

11. A system of at least two (2) finite width oscillator structures for application in mathematical modeling of dielectric function numerical data which demonstrate a dependent-independent variable relationship comprising at least two dependent variable peaks, each said finite width oscillator structure comprising at least one selection from the group consisting of:
   a. a finite-width combination of a finite order polynomial and an essentially zero-width, finite magnitude discontinuity;
   b. a finite-width combination of a plurality of finite order polynomials; and
   c. an essentially zero-width, finite magnitude discontinuity;
   each said finite order polynomial comprising coefficient(s) and each said essentially zero-width finite magnitude discontinuity comprising a magnitude, which finite order polynomial coefficient(s) and essentially zero-width finite magnitude discontinuity magnitude(s) determine finite width oscillator structure mathematical model coefficients; such tat in use, for each of at least two dependent variable peaks in said dielectric function numerical data which demonstrate a dependent-independent variable relationship, a finite width oscillator structure is selected and positioned thereat, and finite width oscillator structure mathematical model coefficients are evaluated by a square-error reducing criteria fit to said dielectric function data, which finite width oscillator structure mathematical model coefficients for each finite width oscillator structure at least partially define a relationship between dependent and independent numerical variables over a range of said independent variable corresponding to the finite width of said finite width oscillator structure.

12. A system of at least two (2) finite width oscillator structures as in claim 11, in which each finite width oscillator structure has defined Center Point, Lower Point and Upper Point independent variables, and such that the Center Point of each finite width oscillator structure is coincident with a Lower or Upper Point of one of said at least two finite width oscillator structures.

13. A system of at least two (2) finite width oscillator structures as in claim 11, in which said finite width oscillator structures are Kronig-Kramer consistent.

14. A method of calculating dielectric function dependent variable numerical values, given independent variable numerical values, comprising the steps of:
   a. obtaining dielectric function dependent vs. independent numerical variable data and identifying independent variable locations of at least two dependent variable peak regions thereon;
   b. for each of at least two of said identified dependent variable peak regions proposing an oscillator structure for application in mathematical modeling of said dielectric function numerical data which demonstrate a dependent-independent variable relationship, each of said at least two proposed oscillator structures comprising at least one component selected from the group consisting of:
      a. a finite-width combination of a finite order polynomial and an essentially zero-width, finite magnitude discontinuity;
      b. a finite-width combination of a plurality of finite order polynomials; and
      c. an essentially zero-width, finite magnitude discontinuity;
      each said finite order polynomial comprising coefficient(s) and each said essentially zero-width finite magnitude discontinuity comprising a magnitude, which finite order polynomial coefficient(s) and essentially zero-width finite magnitude discontinuity magnitude(s) determine finite width oscillator structure mathematical model coefficients, which finite width oscillator structure mathematical model coefficients for each finite width oscillator structure at least partially define a relationship between dependent and independent numerical variables over a range of said independent variable corresponding to the finite width of said finite width oscillator structure;
   c. assigning each said proposed finite width oscillator structure to an appropriate peak in said dielectric function dependent variable vs. independent variable data;
   d. causing a procedure to be executed such that finite width oscillator structure mathematical model coefficients are, for each of said at least two finite width oscillator structures, evaluated; and
   e. utilizing said determined mathematical model coefficients to, for each finite width oscillator structure, calculate dependent variable numerical values which correspond to independent variable values, and combining contributions from each of said at least two finite width oscillator structures at each independent variable value.

15. A method of calculating dependent variable numerical values, as in claim 14, in which step d. is effected utilizing a square-error minimizing criteria.

16. A method of calculating dependent variable numerical values as in claim 14, which further comprises the step of:
   f. inspecting evaluated finite width oscillator structure mathematical model coefficients for correlation therebetween, and inspecting the results provided from practice of step e. thereof for goodness of fit between corresponding calculated dependent variable values and dielectric function dependent variable values, and if said inspections disclose less than user determined desired quality, repeating steps b. through e.

17. A method of calculating dependent variable numerical values, as in claim 14 which, in step d., further comprises the step of applying convolution integration effected Gaussian broadening factors to at least one present non-zero-finite-width oscillator structure(s) which contain finite order polynomial(s), each of which finite order polynomial(s), and said Gaussian broadening factor, involve only a single normalized independent variable such that the result of said convolution integration involves only a single normalized independent variable, thereby producing a one-dimensional look-up table for evaluating a dependent numerical value given an independent numerical value, without the requirement that numerical derivatives and integrations be performed to effect evaluation of said mathematical model coefficients.

18. A finite width oscillator structure for application in mathematical modeling of dielectric function numerical data which demonstrate a dependent-independent variable relationship comprising at least one dependent variable peak, said finite width oscillator structure comprising a selection from the group consisting of:

a. A finite-width combination of a finite order polynomial and an essentially zero-width finite magnitude discontinuity to the right thereof;
   b. a finite-width combination of a finite order polynomial and an essentially zero-width finite magnitude discontinuity to the left thereof;
   c. a finite-width combination of two adjacent finite order polynomials and an essentially zero-width finite magnitude discontinuity to the right thereof, said two adjacent finite order polynomials being merged with continuous zero and optionally higher order derivative(s);
   d. a finite-width combination of two adjacent finite order polynomials and an essentially zero-width finite magnitude discontinuity to the left thereof, said two adjacent finite order polynomials being merged with continuous zero and optionally higher order derivative(s);
   e. a finite-width combination of two adjacent finite order polynomials and an essentially zero-width finite magnitude discontinuity to the left thereof, in combination with two adjacent finite order polynomials to the right of said essentially zero-width finite magnitude discontinuity, with adjacent finite order polynomials being merged with continuous zero and optionally higher order derivative(s);
   f. a finite-width combination of a plurality of adjacent finite order polynomials, with adjacent finite order polynomials being, at points of merger therebetween, merged with continuous zero and optionally higher order derivative(s);
   g. a finite-width combination of one finite order polynomial and an essentially zero-width finite magnitude discontinuity to the left thereof, in combination with two adjacent finite order polynomials to the right of said essentially zero-width finite magnitude discontinuity, with adjacent finite order polynomials being merged with continuous zero and optionally higher order derivative(s);
   h. a finite-with combination of two adjacent finite order polynomials and an essentially zero-width finite magnitude discontinuity to the left thereof, in combination with one finite order polynomial to the right of said essentially zero-width finite magnitude discontinuity, with adjacent finite order polynomials being merged with continuous zero and optionally higher order derivative(s); and
   i. an essentially zero-width, finite magnitude discontinuity;

each said finite order polynomial comprising coefficient(s) and each said essentially zero-width finite magnitude discontinuity comprising a magnitude, which finite order polynomial coefficient(s) and essentially zero-width finite magnitude discontinuity magnitude determine finite width oscillator structure mathematical model coefficients; such that in use said finite width oscillator structure is positioned under a dielectric function dependent variable peak in said dielectric function numerical data which demonstrate a dependent-independent variable relationship comprising at least one dependent variable peak, and finite width oscillator structure mathematical model coefficients are evaluated by a square-error reducing criteria fit to said dielectric function data, which finite width oscillator structure mathematical model coefficients at least partially define a relationship between dependent and independent numerical variables over a range of said independent variable corresponding to the finite width of said finite width oscillator structure.

19. A method of calculating dielectric function dependent variable numerical values, given independent variable numerical values, comprising the steps of:

a. providing dielectric function dependent vs. independent variable data and identifying independent variable locations of at least two dependent variable peak region(s) therein;
   b. for each of at least two of said identified dependent variable peak region(s) proposing an oscillator structure for application in mathematical modeling of said dielectric function numerical data which demonstrate a dependent-independent variable relationship, each of said at least two proposed oscillator structure(s) being selected from the group consisting of:
      a. A finite-width Combination of a finite order polynomial and an essentially zero-width finite magnitude discontinuity to the right thereof;
      b. a finite-width combination of a finite order polynomial and an essentially zero-width finite magnitude discontinuity to the left thereof;
      c. a finite-width combination of two adjacent finite order polynomials and an essentially zero-width finite magnitude discontinuity to the right thereof, said two adjacent finite order polynomials being merged with continuous zero and optionally higher order derivative(s);
      d. a finite-width combination of two adjacent finite order polynomials and an essentially zero-width finite magnitude discontinuity to the left thereof, said two adjacent finite order polynomials being merged with continuous zero and optionally higher order derivative(s);
      e. a finite-width combination of two adjacent finite order polynomials and an essentially zero-width finite magnitude discontinuity to the left thereof, in combination with two adjacent finite order polynomials to the right of said essentially zero-width finite magnitude discontinuity, with adjacent finite order polynomials being merged with continuous zero and optionally higher order derivative(s);
      f. a finite-width combination of a plurality of adjacent finite order polynomials, with adjacent finite order polynomials being, at points of merger therebetween, merged with continuous zero and optionally higher order derivative(s);

g. a finite-width combination of one finite order polynomial and an essentially zero-width finite magnitude discontinuity to the left thereof, in combination with two adjacent finite order polynomials to the right of said essentially zero-width finite magnitude discontinuity, with adjacent finite order polynomials being merged with continuous zero and optionally higher order derivative(s);

h. a finite-width combination of two adjacent finite order polynomials and an essentially zero-width finite magnitude discontinuity to the left thereof, in combination with one finite order polynomial to the right of said essentially zero-width finite magnitude discontinuity, with adjacent finite order polynomials being merged with continuous zero and optionally higher order derivative(s); and i. an essentially zero-width, finite magnitude discontinuity;

each said finite order polynomial comprising coefficient(s) and each said essentially zero-width finite magnitude discontinuity comprising a magnitude, which finite order polynomial coefficient(s) and essentially zero-width finite magnitude discontinuity magnitude(s) determine finite width oscillator structure mathematical model coefficients; which finite width oscillator structure mathematical model coefficients for each finite width oscillator structure at least partially define a relationship between dependent and independent numerical variables over a range of said independent variable corresponding to the finite width of said finite width oscillator structure;

c. assigning each said proposed finite width oscillator structure to an appropriate peak region in said dielectric function dependent variable vs. independent variable data;

d. causing a procedure to be executed such that finite width oscillator structure mathematical model coefficients are, for each of said at least two finite width oscillator structures, evaluated; and e. utilizing said determined mathematical model coefficients to, for each finite width oscillator structure, calculate dependent variable numerical values which correspond to independent variable values, and combining contributions from each of said at least two finite width oscillator structures at each independent variable value.

20. A method of calculating dielectric function dependent variable numerical values, as in claim 19, in which step d. is effected utilizing a square-error minimizing criteria.

21. A method of calculating dielectric function dependent variable numerical values as in claim 19, which further comprises the step of:

f. inspecting evaluated finite width oscillator structure mathematical model coefficients for correlation therebetween, and inspecting the results provided from practice of step e. thereof for goodness of fit between corresponding calculated dependent variable values and dielectric function dependent variable values, and if said inspections disclose less than user determined desired quality, repeating steps b. through e.

22. A method of calculating dependent variable numerical values, as in claim 19 which, in step d., further comprises the step of applying convolution integration effected Gaussian broadening factors to at least one present non-zero-finite-width oscillator structure(s) which contain finite order polynomial(s), each of which finite order polynomial(s) and said Gaussian broadening factor involve only a single normalized independent variable, thereby producing a one-dimensional look-up table for evaluating a dependent numerical value given an independent numerical value, without the requirement that numerical derivatives and integrations be performed to effect evaluation of said mathematical model coefficients.

23. A parameter model for application in mathematical modeling of dielectric function numerical data which demonstrate a dependent-independent variable relationship comprising at least one dependent variable peak, said parameter model utilizing finite width oscillator structure(s) comprising at least one selection from the group consisting of:

a. a finite-width combination of a finite order polynomial and an essentially zero-width, finite magnitude discontinuity;

b. a finite-width combination of a plurality of finite order polynomials; and c. an essentially zero-width, finite magnitude discontinuity;

each said finite order polynomial comprising coefficient(s) and each said essentially zero-width finite magnitude discontinuity comprising a magnitude, which finite order polynomial coefficient(s) and essentially zero-width finite magnitude discontinuity magnitude(s) determine finite width oscillator structure mathematical model coefficients; such that in use said finite width oscillator structure is positioned at a dielectric function dependent variable peak in said dielectric function numerical data which demonstrate a dependent-independent variable relationship comprising at least one dependent variable peak, and finite width oscillator structure mathematical model coefficients are evaluated by a square-error reducing criteria fit to said dielectric function data, which finite width oscillator structure mathematical model coefficients at least partially define a relationship between dependent and independent numerical variables over a range of said independent variable corresponding to the finite width of said finite width oscillator structure, which Parametric model utilizes up to eleven (11) defining mathematical model coefficients for each oscillator structure, said eleven (11) defining coefficients being:

1. a lower independent variable value (EL) at which the corresponding dependent variable is zero (0.0);

2. a center independent variable value (EC);

3. an upper independent variable value (EU) at which the corresponding dependent variable is zero (0.0);

4. a magnitude (A) of a dependent variable corresponding to the center independent variable value (EC);

5. a magnitude of a discontinuity (DISC) which adds to, and subtracts from, the magnitude (A) of the dependent variable corresponding to the center independent variable value (EC) such that a coefficient (AL) is defined by the relation ship AL=A*(1−DISC) and a coefficient (AU) is defined by the relationship AU=A*(1+DISC);

6. a coefficient (Uamp) defined by the relationship AUM= AU*Uamp;

7. a coefficient (Lamp) defined by the relationship ALM= AL*Lamp;

8. a coefficient (Upos) defined by the relationship EUM= EC+(EU-EC)*Upos; and 9. a coefficient (Lpos) defined by the relationship ELM= EC−(EC-EL)*Lpos;

where ALM and ELM are dependent and independent variables respectively at which a finite order polynomial, which begins at dependent and independent variable (0.0) and EL, ends;

and where AUM and EUM are dependent and independent variables respectively at which a finite order polynomial, which ends at dependent and independent variable (0.0) and EU, begins; and where two additional coefficients, 10. (L2d); and 11. (2d);

serve to define the order of the finite order polynomials which begin at ((0.0) and (EL)), and which end at ((EU and (0.0)), respectively; and where (EL), (EC), (EU), (A), (DISC), (Lamp), (Uamp), (Lpos) and (Upos) can be zero (0.0) or some positive value; and where additional finite order polynomials can exist between independent variable and dependent variable points ((ELM) and (ALM)) and ((EC) and (AL)) and/or between independent variable and dependent variable points ((EC) and (AU)) and ((EUM) and (AUM)) if a discontinuity magnitude DISC is other than zero (0.0), and wherein if (A) or (DISC) is non-zero and (EL)=(EC)= (EU), a finite magnitude Pole structure is defined located at (EC), said finite magnitude Pole structure being a special case of an oscillator structure.

24. A parameter model as in claim 23, which further comprises a twelfth (12) finite width oscillator structure mathematical model coefficient;

12. (SIGMA);

for at least one present finite width oscillator structure(s), said twelfth coefficient being a Gaussian broadening factor; the use of which enables non-zero-finite-width oscillator structure Gaussian broadening by convolution integration with each associated finite width oscillator structure finite order polynomial, which finite order polynomial(s) and Gaussian broadening factor, for each finite width oscillator structure, involve a single normalized independent variable, thereby producing a one-dimensional look-up table for evaluating a dependent numerical value given an independent numerical value, without the requirement that numerical derivatives or integrations be performed to effect evaluation of said finite width oscillator structure mathematical model coefficients.

25. A parameter model as in claim 23, in which mathematical model coefficient(s) are evaluated on the basis of a square-error reducing criteria.

* * * * *